(12) United States Patent
Shimizu et al.

(10) Patent No.: US 11,155,717 B2
(45) Date of Patent: Oct. 26, 2021

(54) STORAGE CONTAINER STORING LIQUID COMPOSITION AND METHOD FOR STORING LIQUID COMPOSITION

(71) Applicant: FUJIFILM Corporation, Tokyo (JP)

(72) Inventors: Tetsuya Shimizu, Shizuoka (JP); Ryo Saito, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 107 days.

(21) Appl. No.: 16/217,478

(22) Filed: Dec. 12, 2018

(65) Prior Publication Data

US 2019/0112489 A1 Apr. 18, 2019

Related U.S. Application Data

(63) Continuation of application No. PCT/JP2017/021364, filed on Jun. 8, 2017.

(30) Foreign Application Priority Data

Jun. 13, 2016 (JP) .............................. JP2016-116837

(51) Int. Cl.
| | |
|---|---|
| C09D 5/00 | (2006.01) |
| C09D 183/04 | (2006.01) |
| B65D 85/00 | (2006.01) |
| H01L 21/02 | (2006.01) |
| H01L 23/29 | (2006.01) |
| H01L 23/31 | (2006.01) |

(52) U.S. Cl.
CPC ............... *C09D 5/00* (2013.01); *B65D 85/70* (2013.01); *C09D 183/04* (2013.01); *C23C 2222/20* (2013.01); *H01L 21/02041* (2013.01); *H01L 21/02057* (2013.01); *H01L 23/296* (2013.01); *H01L 23/3171* (2013.01); *Y02W 30/80* (2015.05)

(58) Field of Classification Search
None
See application file for complete search history.

(56) References Cited

U.S. PATENT DOCUMENTS

| 7,749,909 B2 | 7/2010 | Tomita et al. |
| 7,838,425 B2 | 11/2010 | Tomita et al. |
(Continued)

FOREIGN PATENT DOCUMENTS

| JP | 2001-220453 A | 8/2001 |
| JP | 2008-192641 A | 8/2008 |
(Continued)

OTHER PUBLICATIONS

English Translation for Ryokawa et al WO 2013080832 (Ryokawa '832), this version is from the WIPO website using the Google translation (Year: 2013).*

(Continued)

*Primary Examiner* — Colin W. Slifka
(74) *Attorney, Agent, or Firm* — Sughrue Mion, PLLC

(57) ABSTRACT

The storage container according to the embodiment of the present invention includes a storage portion storing a liquid composition containing an organic solvent having a moisture concentration of 400 ppm by mass or less and a surface treatment agent. At least a portion, which is in contact with the liquid composition, of an inner wall of the storage portion has a contact angle θ with respect to water of 10 degrees or more and 150 degrees or less.

30 Claims, 1 Drawing Sheet

(56) References Cited

U.S. PATENT DOCUMENTS

| | | |
|---|---|---|
| 7,985,683 B2 | 7/2011 | Tomita et al. |
| 2009/0311874 A1 | 12/2009 | Tomita et al. |
| 2010/0075504 A1 | 3/2010 | Tomita et al. |
| 2010/0240219 A1 | 9/2010 | Tomita et al. |
| 2012/0018338 A1 | 1/2012 | Bauer Dauphin et al. |
| 2013/0255534 A1 | 10/2013 | Ryokawa et al. |
| 2014/0311379 A1 | 10/2014 | Ryokawa et al. |
| 2017/0062203 A1 | 3/2017 | Ryokawa et al. |

FOREIGN PATENT DOCUMENTS

| | | |
|---|---|---|
| JP | 2010-114414 A | 5/2010 |
| JP | 2010-192878 A | 9/2010 |
| JP | 2010-192879 A | 9/2010 |
| JP | 2010-272852 A | 12/2010 |
| JP | 2012-520098 A | 9/2012 |
| JP | 2013-108044 A | 6/2013 |
| JP | 2013-138178 A | 7/2013 |
| KR | 10-2014-0083046 A | 7/2014 |
| TW | 201329219 A1 | 7/2013 |
| TW | 201329220 A1 | 7/2013 |
| WO | 2013/080832 A1 | 6/2013 |

OTHER PUBLICATIONS

English Translation for Furukawa et al JP 2008-192641, obtained from J-PlatPat (Year: 2008).*

English Translation for Ryokawa et al JP 2013-138178 (Ryokawa '178), obtained from J-PlatPat (Year: 2013).*

International Search Report for PCT/JP2017/021364 dated Aug. 22, 2017 [PCT/ISA/210].

Written Opinion, dated Aug. 22, 2017 from the International Bureau in counterpart International application No. PCT/JP2017/021364.

International Preliminary Report on Patentability and Translation of Written Opinion, dated Dec. 18, 2018 from the International Bureau in counterpart International application No. PCT/JP2017/021364.

Office Action dated Jan. 7, 2020, from the Japanese Patent Office in Japanese application No. 2018-523858.

Office Action from the Japanese Patent Office dated Jul. 28, 2020 in Japanese Application No. 2018-523858.

Kenneth Ong, "Determination of Impurities in Organic Solvents used in the Semiconductor Industry with the NexION 300S/350S ICP-MS", ICP-Mass Spectrometry, Application Note, PerkinElmer, Inc., 2012, pp. 1-5 (5 pages total).

Office Action from the Taiwanese Patent Office, dated Aug. 5, 2020 in Taiwan Application No. 106119378.

Office Action dated Oct. 28, 2020 from the Korean Intellectual Property Office in KR Application No. 10-2018-7037005.

Office Action dated Apr. 2, 2020, from the Korean Intellectual Patent Office in Korean application No. 10-2018-7037005.

Office Action dated Apr. 20, 2021 by the Korean Patent Office in Korean Application No. 10-2018-7037005.

Office Action dated Mar. 26, 2021 from the Taiwanese Patent Office in Taiwanese Application No. 106119378.

* cited by examiner

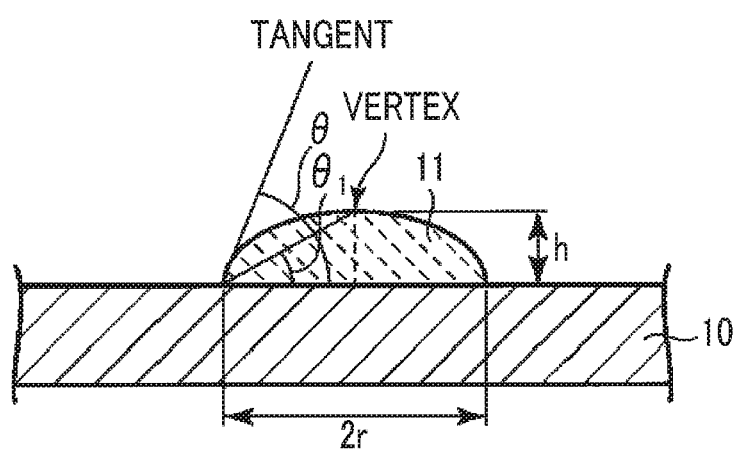

STORAGE CONTAINER STORING LIQUID COMPOSITION AND METHOD FOR STORING LIQUID COMPOSITION

CROSS-REFERENCE TO RELATED APPLICATIONS

This application is a Continuation Application of PCT Application No. PCT/JP2017/021364, filed Jun. 8, 2017, and based upon and claiming the benefit of priority from Japanese Patent Application No. 2016-116837, filed Jun. 13, 2016, the entire contents of which are incorporated herein by reference.

BACKGROUND OF THE INVENTION

1. Field of the Invention

The present invention relates to a storage container in which a liquid composition used for a surface modification application in a semiconductor device manufacturing process or the like is stored and a method for storing the liquid composition.

2. Description of the Related Art

Along with the miniaturization of a circuit pattern in a semiconductor device, a problem caused by an increase in the aspect ratio of the pattern becomes obvious. That is, after cleaning or rinsing, the pattern collapses in the case where the gas-liquid interface passes through the pattern, resulting in a significant reduction in yield, which is a serious problem.

This pattern collapse occurs in the case where the wafer is lifted from the cleaning liquid or the rinsing liquid. This is said to be caused by a difference in height of the residual liquid between a portion having a high aspect ratio of the pattern and a portion having a low aspect ratio of the pattern, thereby causing a difference in the capillary force acting on the pattern.

Therefore, in the case where the capillary force is reduced, it is expected that the difference in capillary force due to the difference in height of the residual liquid will be reduced and then pattern collapse will be resolved. The magnitude of the capillary force is the absolute value of P obtained by the equation shown below, and it is expected that capillary force can be reduced by decreasing $\gamma$ or $\cos\theta$ from this equation.

$P = 2\times\gamma\times\cos\theta/S$ ($\gamma$: surface tension, $\theta$: contact angle, S: pattern dimension (width of concave portion))

In order to solve the above-described problem of pattern collapse, there is known a technique of reducing the surface tension of a liquid acting on a pattern at the time of cleaning or rinsing of a substrate by forming a water-repellent protective film on the substrate surface in advance (For example, see JP2010-114414A, JP2010-192878A, JP2010-192879A, JP2010-272852A, and JP2013-108044A).

SUMMARY OF THE INVENTION

Although the pattern collapse can be suppressed by forming a water-repellent protective film on the substrate surface using the aforementioned related art, it was found that the water repellent performance of the water-repellent protective film was deteriorated depending on the storage conditions of a treatment liquid used for the formation of the water-repellent protective film, and therefore the desired effect of suppressing pattern collapse could not be obtained.

An object of the present invention is to provide a storage container in which a liquid composition used for a surface modification application such as imparting water repellency in a semiconductor device manufacturing process or the like is stored; and a method for storing a liquid composition, more specifically a storage container storing a liquid composition in which deterioration of the surface modification performance due to storage is suppressed; and a method for storing a liquid composition.

Another object of the present invention is to provide a storage container storing a liquid composition, which is capable of suppressing deterioration of the surface modification performance due to storage even in the case of being repeatedly used as a container for storing the above-mentioned liquid composition and which has excellent recyclability; and a method for storing a liquid composition.

The present invention is, for example, as follows.

[1]
A storage container comprising a storage portion storing a liquid composition containing an organic solvent having a moisture concentration of 400 ppm by mass or less and a surface treatment agent, in which at least a portion, which is in contact with the liquid composition, of an inner wall of the storage portion has a contact angle $\theta$ with respect to water of 10 degrees or more and 150 degrees or less.

[2]
The storage container according to [1], in which the surface treatment agent is a silane compound.

[3]
The storage container according to [1] or [2], in which the surface treatment agent is a silylating agent.

[4]
The storage container according to any one of [1] to [3], in which the liquid composition is a composition for forming a water-repellent protective film.

[5]
The storage container according to any one of [1] to [4], in which the portion, which is in contact with the liquid composition, of the inner wall of the storage portion has a contact angle difference $|\theta_B - \theta_A|$ of 3 degrees or more and 15 degrees or less in the case where a contact angle with respect to water after contact with the liquid composition is taken as $\theta_B$ and a contact angle with respect to water before contact with the liquid composition is taken as $\theta_A$.

[6]
The storage container according to any one of [1] to [5], in which the portion, which is in contact with the liquid composition, of the inner wall of the storage portion has a contact angle $\theta_C$ with respect to the liquid composition of less than 90 degrees.

[7]
The storage container according to any one of [1] to [6], in which the organic solvent has a moisture concentration of 200 ppm by mass or less.

[8]
The storage container according to any one of [1] to [7], in which the organic solvent has a moisture concentration of 0.01 ppt by mass to 100 ppm by mass.

[9]
The storage container according to any one of [1] to [8], in which the percentage of the voids in the storage portion storing the liquid composition is 40% to 0.01% by volume.

[10]
The storage container according to any one of [1] to [9], in which the moisture concentration in the gas occupying the voids in the storage portion storing the liquid composition is 0.01 ppt by mass to 1 ppm by mass.

[11]
The storage container according to any one of [1] to [10], in which the liquid composition contains one or two or more metal atoms selected from metal species consisting of Cu, Fe, and Zn, and a total content of the particulate metals including at least one of the metal atoms is 0.01 to 100 ppt by mass based on the total mass of the liquid composition.

[12]
The storage container according to [11], in which the mass of the particulate metal is measured by an SP-ICP-MS method.

[13]
The storage container according to any one of [1] to [12], in which at least a portion, which is in contact with the liquid composition, of the inner wall of the storage portion is formed of a material containing at least one selected from polytetrafluoroethylene, perfluoroalkoxy alkane, polyethylene, or polypropylene.

[14]
The storage container according to any one of [1] to [13], in which at least a portion, which is in contact with the liquid composition, of the inner wall of the storage portion is formed of a material containing at least one selected from stainless steel, Hastelloy, Inconel, or Monel.

[15]
The storage container according to any one of [1] to [14], in which the surface treatment agent is a silylating agent represented by General Formula [1]:

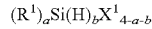

$(R^1)_a Si(H)_b X^1_{4-a-b}$ [1]

in the formula,
$R^1$ represents a monovalent organic group containing a hydrocarbon group having 1 to 18 carbon atoms in which some or all of the hydrogen atoms may be substituted by fluorine atoms, and in the case where there are a plurality of $R^1$'s, the $R^1$'s may be the same or different;
$X^1$ represents a group or atom selected from the group consisting of a monovalent substituent in which an atom bonded to a silicon atom is a nitrogen atom, a monovalent substituent in which an atom bonded to a silicon atom is an oxygen atom, a halogen atom, a nitrile group, and —CO—NH—Si(CH$_3$)$_3$, and in the case where there are a plurality of $X^1$'s, the $X^1$'s may be the same or different; and
a is an integer of 1 to 3, b is an integer of 0 to 2, and the sum of a and b is 1 to 3.

[16]
A method for storing a liquid composition containing an organic solvent having a moisture concentration of 400 ppm by mass or less and a surface treatment agent, comprising storing the liquid composition in a storage container in which at least a portion of the inner wall has a storage portion constituted of a member having a contact angle θ with respect to water of 10 degrees or more and 150 degrees or less.

[17]
The method for storing a liquid composition according to [16], in which the surface treatment agent is a silane compound.

[18]
The method for storing a liquid composition according to [16] or [17], in which the surface treatment agent is a silylating agent.

[19]
The method for storing a liquid composition according to any one of [16] to [18], in which the liquid composition is a composition for forming a water-repellent protective film.

[20]
The method for storing a liquid composition according to any one of [16] to [19], in which the portion, which is in contact with the liquid composition, of the inner wall of the storage portion has a contact angle difference $|θ_B - θ_A|$ of 3 degrees or more and 15 degrees or less in the case where a contact angle with respect to water before contact with the liquid composition is taken as $θ_A$ and a contact angle with respect to water after contact with the liquid composition is taken as $θ_B$.

[21]
The method for storing a liquid composition according to any one of [16] to [20], in which the portion, which is in contact with the liquid composition, of the inner wall of the storage portion has a contact angle $θ_C$ with respect to the liquid composition of less than 90 degrees.

[22]
The method for storing a liquid composition according to any one of [16] to [21], in which the organic solvent has a moisture concentration of 200 ppm by mass or less.

[23]
The method for storing a liquid composition according to any one of [16] to [22], in which the organic solvent has a moisture concentration of 0.01 ppt by mass to 100 ppm by mass.

[24]
The method for storing a liquid composition according to any one of [16] to [23], in which the percentage of the voids in the storage portion storing the liquid composition is 40% to 0.01% by volume.

[25]
The method for storing a liquid composition according to any one of [16] to [24], in which the moisture concentration in the gas occupying the voids in the storage portion storing the liquid composition is 0.01 ppt by mass to 1 ppm by mass.

[26]
The method for storing a liquid composition according to any one of [16] to [25], in which the liquid composition contains one or two or more metal atoms selected from metal species consisting of Cu, Fe, and Zn, and a total content of the particulate metals including at least one of the metal atoms is 0.01 to 100 ppt by mass based on the total mass of the liquid composition.

[27]
The method for storing a liquid composition according to [26], in which the mass of the particulate metal is measured by an SP-ICP-MS method.

[28]
The method for storing a liquid composition according to any one of [16] to [27], in which at least a portion, which is in contact with the liquid composition, of the inner wall of the storage portion is formed of a material containing at least one selected from polytetrafluoroethylene, perfluoroalkoxy alkane, polyethylene, or polypropylene.

[29]
The method for storing a liquid composition according to any one of [16] to [28], in which at least a portion, which is in contact with the liquid composition, of the inner wall of the storage portion is formed of a material containing at least one selected from stainless steel, Hastelloy, Inconel, or Monel.

[30]
The method for storing a liquid composition according to any one of [16] to [29], in which the surface treatment agent is a silylating agent represented by General Formula [1]:

$$(R^1)_a Si(H)_b X^1_{4-a-b} \quad [1]$$

in the formula, $R^1$ represents a monovalent organic group containing a hydrocarbon group having 1 to 18 carbon atoms in which some or all of the hydrogen atoms may be substituted by fluorine atoms, and in the case where there are a plurality of $R^1$'s, the $R^1$'s may be the same or different;

$X^1$ represents a group or atom selected from the group consisting of a monovalent substituent in which an atom bonded to a silicon atom is a nitrogen atom, a monovalent substituent in which an atom bonded to a silicon atom is an oxygen atom, a halogen atom, a nitrile group, and —CO—NH—Si(CH$_3$)$_3$, and in the case where there are a plurality of $X^1$'s, the $X^1$'s may be the same or different; and a is an integer of 1 to 3, b is an integer of 0 to 2, and the sum of a and b is 1 to 3.

According to the present invention, there are provided a storage container in which a liquid composition used for a surface modification application such as imparting water repellency in a semiconductor device manufacturing process or the like is stored; and a method for storing a liquid composition, more specifically a storage container storing a liquid composition in which deterioration of the surface modification performance due to storage is suppressed; and a method for storing a liquid composition.

Further, according to the present invention, there are provided a storage container storing a liquid composition, which is capable of suppressing deterioration of the surface modification performance due to storage even in the case of being repeatedly used as a container storing the above-mentioned liquid composition and which has excellent recyclability; and a method for storing a liquid composition.

BRIEF DESCRIPTION OF THE DRAWINGS

FIG. 1 is a conceptual diagram for explaining a contact angle.

DESCRIPTION OF THE PREFERRED EMBODIMENTS

In the notation of a group (atomic group) in the present specification, notation not describing substitution and non-substitution also includes those having a substituent as well as those having no substituent. For example, the term "alkyl group" includes not only an alkyl group having no substituent (unsubstituted alkyl group) but also an alkyl group having a substituent (substituted alkyl group).

The term "actinic rays" or "radiation" as used herein refers to, for example, a bright line spectrum of mercury lamp, far ultraviolet rays represented by excimer laser, extreme ultraviolet (EUV) rays, X-rays, or electron beams (EB). The term "light" as used herein refers to actinic rays or radiation.

Unless otherwise indicated, the term "exposure" as used herein includes not only exposure to a mercury lamp, far ultraviolet rays represented by excimer laser, X-rays, EUV light, or the like but also lithography with particle beams such as electron beams or ion beams.

The term "(meth)acrylate" as used herein refers to "at least one of acrylate or methacrylate". The term "(meth)acrylic acid" refers to "at least one of acrylic acid or methacrylic acid".

The numerical range shown with "to" as used herein refers to a range including the numerical values indicated before and after "to" as a lower limit value and an upper limit value, respectively.

Hereinafter, embodiments of the present invention will be described in detail.

The liquid composition to be filled in the storage container of the present invention is a liquid composition used for surface modification applications such as imparting water repellency in a semiconductor device manufacturing process or the like (hereinafter, also referred to as "treatment liquid"), and contains a surface treatment agent and an organic solvent. The organic solvent is an organic solvent having a moisture concentration of 400 ppm (parts per million) by mass or less (hereinafter, also referred to as "non-aqueous organic solvent").

The present invention relates to a specific storage container in which the liquid composition is stored. Further, the present invention relates to a storage method for storing and preserving the liquid composition in a specific storage container. The term "specific storage container" as used herein, as will be described in detail later, refers to a storage container in which at least a portion of the inner wall of the storage portion where the liquid composition is stored in contact with the liquid composition has a contact angle θ with respect to water of 10 degrees or more and 150 degrees or less.

Hereinafter, the liquid composition will be described, and then the storage container will be described.

<Liquid Composition>

As described above, the liquid composition of the present invention is used for surface modification applications such as imparting water repellency in a semiconductor device manufacturing process, and contains a surface treatment agent and a non-aqueous organic solvent. The liquid composition of the present invention may further contain an acid or a base.

In one embodiment, the liquid composition of the present invention is preferably a composition that is substantially free of water. The phrase "substantially free of water" as used herein means that the composition does not contain a raw material to which moisture is intentionally added, except for moisture that can exist equilibrium like adsorbed water, and the composition is prepared without intentional addition of moisture during the preparation of the composition.

In one embodiment, the moisture concentration in the liquid composition of the present invention is preferably 400 ppm by mass or less with respect to total mass of the liquid composition. In order to improve the recyclability of the container, the moisture concentration is preferably 200 ppm by mass or less, more preferably 100 ppm by mass or less, and still more preferably 50 ppm by mass or less. Ideally, the moisture concentration is 0 ppm by mass, but it may be, for example, 0.01 ppt (parts per trillion) by mass or more.

The liquid composition of the present invention is preferably used, for example, for forming a water-repellent protective film.

In the present invention, the water-repellent protective film is a film which is formed on the wafer surface to thereby lower the wettability of the wafer surface, that is, a film which imparts water repellency. In the present invention, the term "water repellency" means to lower the surface energy of the surface of the article to reduce interactions such as hydrogen bonds or intermolecular forces, (at the interface) between water or other liquids and the surface of the article. In particular, the water-repellent protective film has a large effect of reducing the interaction with water, but has an effect of reducing the interaction even with a mixed liquid of water and a liquid other than water, or a liquid other than water. By reducing the interaction, the contact angle of the liquid with respect to the article surface can be increased. Hereinafter, the water-repellent protective film may be simply referred to as "protective film".

In the case where the wafer is processed using the liquid composition of the present invention, since the protective film is formed at least on the surface of the concave portion in the case where the cleaning liquid is removed from the concave portion of the concavo-convex pattern of the wafer, that is, in the case where the wafer is dried, the capillary force on the surface of the concave portion becomes small and therefore pattern collapse hardly occurs.

In one embodiment, at the time of cleaning a wafer which has a concavo-convex pattern on the surface thereof and in which at least a portion of the concavo-convex pattern contains a silicon atom, the liquid composition of the present invention is used to form a water-repellent protective film on at least the surface of the concave portion of the concavo-convex pattern.

[Non-Aqueous Organic Solvent]

As the organic solvent (non-aqueous organic solvent) having a moisture concentration of 400 ppm by mass or less contained in the liquid composition of the present invention, for example, it is preferable to use an organic solvent having a grade of extremely low water and metallic impurities, and it is preferable to use a further dehydrated and purified non-aqueous organic solvent thereof.

In the embodiment of the present invention, the liquid composition is obtained by mixing the non-aqueous organic solvent after this dehydration step (more preferably after dehydration and purification step), a surface treatment agent, and, if applicable, an optional components such as an acid or a base (mixing step).

In the dehydration step, in the case where the moisture concentration in the non-aqueous organic solvent is adjusted to 400 ppm by mass or less, the decrease in the activity of the surface treatment agent and, if applicable, the acid or base due to hydrolysis or the like hardly occurs in the case where the non-aqueous organic solvent, the surface treatment agent, and, if applicable, the acid or base are mixed in the subsequent mixing step. In this case, by using the liquid composition obtained through the mixing step, it is possible to impart excellent water repellency to the surface of the concave portion of the wafer. Further, since deterioration over time of the surface treatment agent and, if applicable, the acid or base in the liquid composition is reduced, the pot life of the liquid composition is excellent.

The moisture concentration in the non-aqueous organic solvent is preferably 200 ppm by mass or less, more preferably 100 ppm by mass or less, and still more preferably 50 ppm by mass or less. This is because the water repellency-imparting effect and the pot life of the liquid composition become more excellent. In the dehydration step, the moisture concentration in the non-aqueous organic solvent is ideally 0 ppm by mass, but it may be, for example, 0.01 ppt (parts per trillion) by mass or more. In the present invention, the moisture concentration can be measured, for example, by measurement with a Karl Fischer moisture meter.

The dehydration step can be carried out by a known method, which is preferably, for example, at least one method selected from the group consisting of purification of a non-aqueous organic solvent by distillation, addition of a water adsorbent insoluble in a non-aqueous organic solvent (for example, a molecular sieve) to remove water from the solvent, and replacement by aeration with a dry inert gas, and heating or vacuum heating.

The water adsorbent insoluble in a non-aqueous organic solvent is preferably at least one selected from the group consisting of zeolite, diphosphorus pentaoxide, silica gel, calcium chloride, sodium sulfate, magnesium sulfate, anhydrous zinc chloride, fuming sulfuric acid, and soda lime.

Specific examples of the non-aqueous organic solvent that can be contained in the liquid composition of the present invention include hydrocarbons such as toluene, benzene, xylene, hexane, heptanes, and octane; esters such as ethyl acetate, propyl acetate, butyl acetate, and ethyl acetoacetate; ethers such as diethyl ether, dipropyl ether, dibutyl ether, tetrahydrofuran, and dioxane; ketones such as acetone, acetylacetone, methyl ethyl ketone, methyl propyl ketone, methyl butyl ketone, cyclohexanone, and isophorone; perfluorocarbons such as perfluorooctane, perfluorononane, perfluorocyclopentane, perfluorocyclohexane, and hexafluorobenzene; hydrofluorocarbons such as perfluorocarbons such as 1,1,1,3,3-pentafluorobutane, octafluorocyclopentane, 2,3-dihydrodecafluoropentane, and ZEORORA H (manufactured by Zeon Corporation); hydrofluoroethers (HFE) such as methyl perfluoroisobutyl ether, methyl perfluorobutyl ether, ethyl perfluorobutyl ether, ethyl perfluoroisobutyl ether, ASAHIKLIN AE-3000 (manufactured by Asahi Glass Company), Novec (registered trademark) 7100, Novec 7200, Novec 7300, and Novec 7600 (all manufactured by 3M Company); chlorocarbon such as tetrachloromethane; hydrochlorocarbon such as chloroform; chlorofluorocarbon such as dichlorodifluoromethane; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, and 1,2-dichloro-3,3,3-trifluoropropene; halogen-containing solvents such as perfluoroether and perfluoropolyether; a sulfoxide-based solvent such as dimethylsulfoxide; lactone-based solvents such as γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, and ε-hexanolactone; carbonate-based solvents such as dimethyl carbonate, ethyl methyl carbonate, diethyl carbonate, and propylene carbonate; alcohols such as methanol, ethanol, propanol, butanol, ethylene glycol, diethylene glycol, 1,2-propanediol, 1,3-propanediol, dipropylene glycol, 1,2-butanediol, 1,3-butanediol, 1,4-butanediol, triethylene glycol, tripropylene glycol, tetraethylene glycol, tetrapropylene glycol, and glycerin; derivatives of polyhydric alcohols such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether, butylene glycol monomethyl ether, ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetracthylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate (PGMEA), propylene glycol monoethyl ether acetate, propylene glycol monobutyl ether acetate, propylene glycol diacetate, dipropylene glycol dimethyl ether, dipropylene glycol methylpropyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, and glycerin triacetate; and nitrogen element-containing solvents such as formamide, N,N-dimethylformamide, N,N-dimethylacetamide, N-methyl-2-pyrrolidone, diethylamine, triethylamine, and pyridine.

In the case where the liquid composition of the present invention contains a silylating agent to be described later as a surface treatment agent, the non-aqueous organic solvent is preferably at least one selected from the group consisting of hydrocarbons, esters, ethers, ketones, halogen-containing solvents, sulfoxide-based solvents, lactone-based solvents, carbonate-based solvents, derivatives of polyhydric alcohols having no OH group, and nitrogen element-containing solvents having no N—H group. Since the silylating agent tends to react with a non-aqueous organic solvent containing an OH group or an N—H group, the reactivity of the silylating agent may be reduced in the case where a non-aqueous organic solvent containing an OH group or an N—H group is used as the non-aqueous organic solvent, and as a result, it may be difficult to develop water repellency in a short time. On the other hand, since the silylating agent hardly reacts with a non-aqueous organic solvent not containing an OH group or an N—H group, the reactivity of the silylating agent is difficult to reduce in the case where a non-aqueous organic solvent not containing an OH group or an N—H group is used as the non-aqueous organic solvent, and as a result, water repellency is easily developed in a short time. The non-aqueous organic solvent not containing an OH group or an N—H group may be either a non-aqueous polar organic solvent not containing an OH group or an N—H group may be either a non-aqueous polar solvent not containing an OH group or an N—H group or a non-aqueous nonpolar solvent not containing an OH group or an N—H group.

In the case where a non-flammable one is used for part or all of the non-aqueous organic solvent, the chemical liquid for forming a protective film becomes non-flammable or the flash point becomes high, and the danger of the chemical liquid decreases, which is therefore preferable. Many halogen-containing solvents are non-flammable, and non-flammable halogen-containing solvents can be suitably used as non-flammable organic solvents.

In addition, in the case where a solvent having a flash point of higher than 70° C. is used as the non-aqueous organic solvent, it is preferable from the viewpoint of safety under fire law.

According to "Globally Harmonized System of Classification and Labelling of Chemicals (GHS)", a solvent with a flash point of 93° C. or lower is defined as a "flammable liquid". Therefore, in the case where a solvent having a flash point of higher than 93° C. is used as the non-aqueous organic solvent, the flash point of the protective film forming chemical liquid tends to exceed 93° C. even in the case where it is not a non-flammable solvent, which is more preferable from the viewpoint of safety since the chemical liquid does not easily correspond to a "flammable liquid".

Among lactone-based solvents, carbonate-based solvents, and derivatives of polyhydric alcohols, those having no OH group are often high in flash point, so that the risk of the chemical liquid for forming a protective film can be lowered, which is therefore preferable. Specifically, from the viewpoint of the safety, it is more preferable to use, as the non-aqueous organic solvent, the following compounds having a flash point of higher than 70° C., such as γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone, propylene carbonate, ethylene glycol dibutyl ether, ethylene glycol monobutyl ether acetate, ethylene glycol diacetate, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol diacetate, dipropylene glycol methyl propyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol diacetate, and glycerin triacetate; and it is still more preferable to use, as the non-aqueous organic solvent, the following compounds having a flash point of higher than 93° C., such as γ-butyrolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone, propylene carbonate, ethylene glycol diacetate, diethylene glycol butyl methyl ether, diethylene glycol dibutyl ether, diethylene glycol diacetate, diethylene glycol monomethyl ether acetate, diethylene glycol monoethyl ether acetate, diethylene glycol monobutyl ether acetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol diacetate, dipropylene glycol diacetate, dipropylene glycol monomethyl ether acetate, dipropylene glycol monoethyl ether acetate, dipropylene glycol monobutyl ether acetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol diacetate, and glycerin triacetate.

In the liquid composition of the present invention, non-aqueous organic solvents may be used in combination of two or more thereof.

[Surface Treatment Agent]

The surface treatment agent contained in the liquid composition of the present invention is not particularly limited as an application, but it is used, for example, for controlling the hydrophilic/hydrophobic properties of the surface of a substance.

Examples of the surface treatment agent include an alkylating agent, a silane compound, an aluminum-based coupling agent, a titanate-based coupling agent, a zirconate coupling agent, a tin coupling agent, and a zirconium aluminate coupling agent. Among them, in the surface treatment application in a semiconductor device manufacturing process, it is more preferable to use a silane compound. Here, the silane compound is a compound having a hydrogen-silicon bond or a carbon-silicon bond in the molecule, and specific examples thereof include a silylating agent and a silane coupling agent. In the liquid composition of the present invention, surface treatment agents may be used in combination of two or more thereof.

Alkylating Agent

The alkylating agent is preferably, for example, a compound represented by $R^7$—X. In this general formula, $R^7$ represents a hydrogen atom, an alkyl group having 1 to 20 carbon atoms, an allyl group or a benzyl group, and X represents a fluorine atom, a chlorine atom, a bromine atom, an iodine atom, a mesyloxy group, a tosyloxy group or a trifluoromethylsulfonyloxy group.

Specific examples of the alkylating agent include trialkyloxonium tetrafluoroborate, alkyl triflate, dialkyl sulfate, alkyl tosylate, alkyl mesylate, alkyl iodide, alkyl bromide, alkyl chloride, and alkyl fluoride.

Silylating Agent

The silylating agent is preferably at least one selected from the group consisting of silicon-containing compounds represented by General Formula [1].

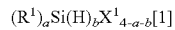

in the formula, $R^1$ represents a monovalent organic group containing a hydrocarbon group having 1 to 18 carbon atoms in which some or all of the hydrogen atoms may be substituted by fluorine atoms, and in the case where there are a plurality of $R^1$'s, the $R^1$'s may be the same or different;

$X^1$ represents a group or atom selected from the group consisting of a monovalent substituent in which an atom bonded to a silicon atom is a nitrogen atom, a monovalent substituent in which an atom bonded to a silicon atom is an oxygen atom, a halogen atom, a nitrile group, and —CO—NH—Si(CH$_3$)$_3$, and in the case where there are a plurality of $X^1$'s, the $X^1$'s may be the same or different; and a is an integer of 1 to 3, b is an integer of 0 to 2, and the sum of a and b is 1 to 3.

$R^1$ in General Formula [1] has an effect of lowering the surface energy of a protective film formed using the liquid composition of the present invention to reduce interactions (at the interface) between water or other liquids and the surface of the protective film. For example, $R^1$ reduces interactions such as hydrogen bonds or intermolecular forces. In particular, $R^1$ has a large effect of reducing the interaction with water, but has an effect of reducing the interaction even with a mixed liquid of water and a liquid other than water, or a liquid other than water. This makes it possible to increase the contact angle of the liquid with respect to the article surface.

$X^1$ in General Formula [1] is a reactive site having reactivity to a silanol group which is a reaction site of a silicon wafer. The reactive site reacts with the silanol group of the wafer, and the silylating agent chemically bonds with the silicon element of the silicon wafer through a siloxane bond, whereby the protective film is formed. Upon cleaning the silicon wafer using a cleaning liquid, in the case where the cleaning liquid is removed from the concave portion of the wafer, that is, in the case where the wafer is dried, the formation of the protective film on the surface of the concave portion leads to a decrease in capillary force on the surface of the concave portion, whereby pattern collapse hardly occurs.

The monovalent substituent in which the atom bonded to the silicon atom is nitrogen, which is an example of $X^1$ in General Formula [1], may contain not only hydrogen, carbon, and nitrogen but also atoms such as oxygen, silicon, sulfur, and halogen. Examples of the substituent include an isocyanate group, an amino group, a dialkylamino group, an isothiocyanate group, an azide group, an acetamide group, —N(CH$_3$)C(O)CH$_3$, —N(CH$_3$)C(O)CF$_3$, —N=C(CH$_3$)OSi(CH$_3$)$_3$, —N=C(CF$_3$)OSi(CH$_3$)$_3$, —NHC(O)—OSi(CH$_3$)$_3$, —NHC(O)—NH—Si(CH$_3$)$_3$, an imidazole ring (Formula [7]), an oxazolidinone ring (Formula [8]), a morpholine ring (Formula [9]), —NH—C(O)—Si(CH$_3$)$_3$, and —N(H)$_{2-h}$(Si(H)$_i$R$^9_{3-i}$)$_h$ (where R$^9$ is a monovalent hydrocarbon group having 1 to 18 carbon atoms in which some or all of the hydrogen elements may be substituted by fluorine elements, h is 1 or 2, and i is an integer of 0 to 2).

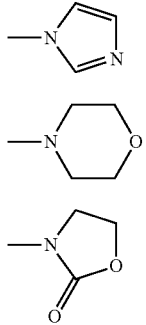

The monovalent substituent in which the atom bonded to the silicon atom is oxygen, which is an example of X$^1$ in General Formula [1], may contain not only hydrogen, carbon, and oxygen but also atoms such as nitrogen, silicon, sulfur, and halogen. Examples of the substituent include an alkoxy group, —OC(CH$_3$)=CHCOCH$_3$, —OC(CH$_3$)=N—Si(CH$_3$)$_3$, —OC(CF$_3$)=N—Si(CH$_3$)$_3$, —O—CO—R$^{10}$ (where R$^{10}$ is a monovalent hydrocarbon group having 1 to 18 carbon atoms in which some or all of the hydrogen elements may be substituted by a fluorine atom or the like), and an alkylsulfonate group in which some or all of the hydrogen atoms may be substituted by a fluorine atom or the like.

Examples of the halogen atom, which is an example of X$^1$ in General Formula [1], include a chloro atom, a bromo atom, and an iodo atom.

Examples of the silylating agent represented by General Formula [1] include an alkyl methoxy silane such as CH$_3$Si(OCH$_3$)$_3$, C$_2$H$_5$Si(OCH$_3$)$_3$, C$_3$H$_7$Si(OCH$_3$)$_3$, C$_4$H$_9$Si(OCH$_3$)$_3$, C$_5$H$_{11}$Si(OCH$_3$)$_3$, C$_6$H$_{13}$Si(OCH$_3$)$_3$, C$_7$H$_{15}$Si(OCH$_3$)$_3$, C$_8$H$_{17}$Si(OCH$_3$)$_3$, C$_9$H$_{19}$Si(OCH$_3$)$_3$, C$_{10}$H$_{21}$Si(OCH$_3$)$_3$, C$_{11}$H$_{23}$Si(OCH$_3$)$_3$, C$_{12}$H$_{25}$Si(OCH$_3$)$_3$, C$_{13}$H$_{27}$Si(OCH$_3$)$_3$, C$_{14}$H$_{29}$Si(OCH$_3$)$_3$, C$_{15}$H$_{31}$Si(OCH$_3$)$_3$, C$_{16}$H$_{33}$Si(OCH$_3$)$_3$, C$_{17}$H$_{35}$Si(OCH$_3$)$_3$, C$_{18}$H$_{37}$Si(OCH$_3$)$_3$, CH$_3$Si(CH$_3$)(OCH$_3$)$_2$, C$_2$H$_5$Si(CH$_3$)(OCH$_3$)$_2$, C$_3$H$_7$Si(CH$_3$)(OCH$_3$)$_2$, (C$_3$H$_7$)$_2$Si(OCH$_3$)$_2$, C$_4$H$_9$Si(CH$_3$)(OCH$_3$)$_2$, (C$_4$H$_9$)$_2$Si(OCH$_3$)$_2$, C$_5$H$_{11}$Si(CH$_3$)(OCH$_3$)$_2$, C$_6$H$_{13}$Si(CH$_3$)(OCH$_3$)$_2$, C$_7$H$_{15}$Si(CH$_3$)(OCH$_3$)$_2$, C$_8$H$_{17}$Si(CH$_3$)(OCH$_3$)$_2$, C$_9$H$_{19}$Si(CH$_3$)(OCH$_3$)$_2$, C$_{10}$H$_{21}$Si(CH$_3$)(OCH$_3$)$_2$, C$_{11}$H$_{23}$Si(CH$_3$)(OCH$_3$)$_2$, C$_{12}$H$_{25}$Si(CH$_3$)(OCH$_3$)$_2$, C$_{13}$H$_{27}$Si(CH$_3$)(OCH$_3$)$_2$, C$_{14}$H$_{29}$Si(CH$_3$)(OCH$_3$)$_2$, C$_{15}$H$_{31}$Si(CH$_3$)(OCH$_3$)$_2$, C$_{16}$H$_{33}$Si(CH$_3$)(OCH$_3$)$_2$, C$_{17}$H$_{35}$Si(CH$_3$)(OCH$_3$)$_2$, C$_{18}$H$_{37}$Si(CH$_3$)(OCH$_3$)$_2$, (CH$_3$)$_3$SiOCH$_3$, C$_2$H$_5$Si(CH$_3$)$_2$OCH$_3$, (C$_2$H$_5$)$_2$Si(CH$_3$)OCH$_3$, (C$_2$H$_5$)$_3$SiOCH$_3$, C$_3$H$_7$Si(CH$_3$)$_2$OCH$_3$, (C$_3$H$_7$)$_2$Si(CH$_3$)OCH$_3$, (C$_3$H$_7$)$_3$SiOCH$_3$, C$_4$H$_9$Si(CH$_3$)$_2$OCH$_3$, (C$_4$H$_9$)$_3$SiOCH$_3$, C$_5$H$_{11}$Si(CH$_3$)$_2$OCH$_3$, C$_6$H$_{13}$Si(CH$_3$)$_2$OCH$_3$, C$_7$H$_{15}$Si(CH$_3$)$_2$OCH$_3$, C$_8$H$_{17}$Si(CH$_3$)$_2$OCH$_3$, C$_9$H$_{19}$Si(CH$_3$)$_2$OCH$_3$, C$_{10}$H$_{21}$Si(CH$_3$)$_2$OCH$_3$, C$_{11}$H$_{23}$Si(CH$_3$)$_2$OCH$_3$, C$_{12}$H$_{25}$Si(CH$_3$)$_2$OCH$_3$, C$_{13}$H$_{27}$Si(CH$_3$)$_2$OCH$_3$, C$_{14}$H$_{29}$Si(CH$_3$)$_2$OCH$_3$, C$_{15}$H$_{31}$Si(CH$_3$)$_2$OCH$_3$, C$_{16}$H$_{33}$Si(CH$_3$)$_2$OCH$_3$, C$_{17}$H$_{35}$Si(CH$_3$)$_2$OCH$_3$, C$_{18}$H$_{37}$Si(CH$_3$)$_2$OCH$_3$, (CH$_3$)$_2$Si(H)OCH$_3$, CH$_3$Si(H)$_2$OCH$_3$, (C$_2$H$_5$)$_2$Si(H)OCH$_3$, C$_2$H$_5$Si(H)$_2$OCH$_3$, C$_2$H$_5$Si(CH$_3$)(H)OCH$_3$, or (C$_3$H$_7$)$_2$Si(H)OCH$_3$; a fluoroalkyl methoxy silane such as CF$_3$CH$_2$CH$_2$Si(OCH$_3$)$_3$, C$_2$F$_5$CH$_2$CH$_2$Si(OCH$_3$)$_3$, C$_3$F$_7$CH$_2$CH$_2$Si(OCH$_3$)$_3$, C$_4$F$_9$CH$_2$CH$_2$Si(OCH$_3$)$_3$, C$_5$F$_{11}$CH$_2$CH$_2$Si(OCH$_3$)$_3$, C$_6$F$_{13}$CH$_2$CH$_2$Si(OCH$_3$)$_3$, C$_7$F$_{15}$CH$_2$CH$_2$Si(OCH$_3$)$_3$, C$_8$F$_{17}$CH$_2$CH$_2$Si(OCH$_3$)$_3$, CF$_3$CH$_2$CH$_2$Si(CH$_3$)(OCH$_3$)$_2$, C$_2$F$_5$CH$_2$CH$_2$Si(CH$_3$)(OCH$_3$)$_2$, C$_3$F$_7$CH$_2$CH$_2$Si(CH$_3$)(OCH$_3$)$_2$, C$_4$F$_9$CH$_2$CH$_2$Si(CH$_3$)(OCH$_3$)$_2$, C$_5$F$_{11}$CH$_2$CH$_2$Si(CH$_3$)(OCH$_3$)$_2$, C$_6$F$_{13}$CH$_2$CH$_2$Si(CH$_3$)(OCH$_3$)$_2$, C$_7$F$_{15}$CH$_2$CH$_2$Si(CH$_3$)(OCH$_3$)$_2$, C$_8$F$_{17}$CH$_2$CH$_2$Si(CH$_3$)(OCH$_3$)$_2$, CF$_3$CH$_2$CH$_2$Si(CH$_3$)$_2$OCH$_3$, C$_2$F$_5$CH$_2$CH$_2$Si(CH$_3$)$_2$OCH$_3$, C$_3$F$_7$CH$_2$CH$_2$Si(CH$_3$)$_2$OCH$_3$, C$_4$F$_9$CH$_2$CH$_2$Si(CH$_3$)$_2$OCH$_3$, C$_5$F$_{11}$CH$_2$CH$_2$Si(CH$_3$)$_2$OCH$_3$, C$_6$F$_{13}$CH$_2$CH$_2$Si(CH$_3$)$_2$OCH$_3$, C$_7$F$_{15}$CH$_2$CH$_2$Si(CH$_3$)$_2$OCH$_3$, C$_8$F$_{17}$CH$_2$CH$_2$Si(CH$_3$)$_2$OCH$_3$, or CF$_3$CH$_2$CH$_2$Si(CH$_3$)(H)OCH$_3$; an alkoxysilane compound in which the methyl group portion of the methoxy group of the alkyl methoxy silane or the fluoroalkyl methoxy silane is substituted by a monovalent hydrocarbon group having 2 to 18 carbon atoms; and a compound in which the methoxy group of the alkyl methoxy silane or the fluoroalkyl methoxy silane is substituted by —OC(CH$_3$)=CHCOCH$_3$, —OC(CH$_3$)=N—Si(CH$_3$)$_3$, —OC(CF$_3$)=N—Si(CH$_3$)$_3$, —O—CO—R$^{10}$ (where R$^{10}$ is a monovalent hydrocarbon group having 1 to 18 carbon atoms in which some or all of the hydrogen elements may be substituted by a fluorine element or the like), an alkylsulfonate group in which some or all of the hydrogen elements may be substituted by a fluorine element or the like, an isocyanate group, an amino group, a dialkylamino group, an isothiocyanate group, an azido group, an acetamido group, —N(CH$_3$)C(O)CH$_3$, —N(CH$_3$)C(O)CF$_3$, —N=C(CH$_3$)OSi(CH$_3$)$_3$, —N=C(CF$_3$)OSi(CH$_3$)$_3$, —NHC(O)—OSi(CH$_3$)$_3$, —NHC(O)—NH—Si(CH$_3$)$_3$, an imidazole ring, an oxazolidinone ring, a morpholine ring, —NH—C(O)—Si(CH$_3$)$_3$, —N(H)$_{2-h}$(Si(H)$_i$R$^9_{3-i}$)$_h$ (where R$^9$ is a monovalent hydrocarbon group having 1 to 18 carbon atoms in which some or all of the hydrogen elements may be substituted by fluorine elements, h is 1 or 2, and i is an integer of 0 to 2), a chloro atom, a bromo atom, an iodo atom, a nitrile group, or —CO—NH—Si(CH$_3$)$_3$.

In the case where the number of X$^1$ represented by 4-a-b in General Formula [1] is 1, it is more preferable since the protective film can be formed homogeneously.

R$^1$ in General Formula [1] is preferably at least one group selected from hydrocarbon groups having 1 to 18 carbon atoms in which some or all of the hydrogen atoms may be substituted by fluorine atoms, and more preferably at least one group selected from C$_m$H$_{2m+1}$ (where m=1 to 18) and CF$_2$F$_{2n+1}$CH$_2$CH$_2$ (where n=1 to 8). In this case, the wettability of the surface can be further lowered in the case where a protective film is formed on the surface of the concavo-convex pattern, that is, more excellent water repellency can be imparted to the surface, which is therefore more preferable. Further, in the case where m is 1 to 12 and n is 1 to 8, a protective film can be formed on the surface of the concavo-convex pattern in a short time, which is therefore more preferable.

Silane Coupling Agent

The silane coupling agent is preferably at least one selected from the group consisting of silicon-containing compounds represented by General Formula [2].

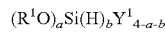

In the formula,

R$^1$ represents a monovalent organic group including a hydrocarbon group having 1 to 18 carbon atoms in which some or all of the hydrogen atoms may be substituted by fluorine atoms. In the case where there are a plurality of R$^1$'s, the R$^1$'s may be the same or different.

Y$^1$ may be, for example, an unsubstituted monovalent hydrocarbon group such as an alkyl group, a cycloalkyl group, an alkenyl group, an aryl group, or an aralkyl group each having 1 to 12 carbon atoms (particularly preferably having 1 to 10 carbon atoms); a substituted monovalent hydrocarbon group in which some or all of the hydrogen atoms of these groups are substituted by a halogen atom (such as chlorine, fluorine, or bromine atoms) or a functional group, for example, a cyano group, an oxyalkylene group such as oxyethylene group, a polyoxyalkylene group such as polyoxyethylene group, a (meth)acryl group, a (meth)acryloxy group, an acryloyl group, a methacryloyl group, a mercapto group, an amino group, an amide group, a ureido group, or an epoxy group; or a group having an oxygen atom, an NH group, an NCH$_3$ group, an NC$_6$H$_5$ group, a C$_6$H$_5$NH— group, a H$_2$NCH$_2$CH$_2$NH— group, or the like interposed, in the unsubstituted or substituted monovalent hydrocarbon group.

a is an integer of 1 to 3, b is an integer of 0 to 2, and the sum of a and b is 1 to 3.

Specific examples of the silane coupling agent include vinyl silane such as vinyltrichlorosilane, vinyltris(β-methoxyethoxy)silane, vinyltriethoxysilane, or vinyltrimethoxysilane; γ-methacryloxypropyltrimethoxysilane; epoxysilane such as β-(3,4-epoxycyclohexyl)ethyltrimethoxysilane, γ-glycidoxypropyitrimethoxysilane, or γ-glycidoxypropylmethyldiethoxysilane; aminosilane such as N-β-(aminoethyl)-γ-aminopropyltrimethoxysilane, N-β-(aminoethyl)-γ-aminopropylmethyldimethoxysilane, γ-aminopropyltrimethoxysilane, or N-phenyl-γ-aminopropyltrimethoxysilane; and other silane coupling agents such as γ-mercaptopropyltrimethoxysilane, γ-chloropropylmethyldimethoxysilane, or γ-chloropropylmethyldiethoxysilane.

Titanate-Based Coupling Agent

Examples of the titanate-based coupling agent include titanate coupling agents such as amine type, phosphorous acid type, pyrophosphoric acid type, and carboxylic acid type coupling agents. Specific examples thereof include isopropyl triisostearoyl titanate, isopropyl tridodecyl benzene sulfonyl titanate, isopropyl tris(dioctylpyrophosphate) titanate, tetraisopropyl bis(dioctylphosphitc) titanate, tetraoctyl bis(ditridecylphosphite) titanate, tetra(2,2-diallyloxymethyl)bis(ditridecyl)phosphite titanate, bis(dioctylpyrophosphate)oxyacetate titanate, bis(dioctylpyrophosphate) ethylcne titanate, isopropyl trioctanoyl titanate, isopropyl dimethacryl isostearoyl titanate, isopropyl isostearoyl diacryl titanate, isopropyl tri(dioctylphosphate) titanate, isopropyl tricumyl phenyl titanate, isopropyl tri(N-aminoethyl-aminoethyl) titanate, dicumyl phenyl oxyacetate titanate, and diisostearoyl ethylene titanate.

Aluminum-Based Coupling Agent

Examples of the aluminum-based coupling agent include aluminum isopropylate, mono sec-butoxy aluminum diisopropylate, aluminum sec-butylate, aluminum ethylate, ethyl acetoacetate aluminum diisopropylate, aluminum tris(ethylacetoacetate), alkyl acetoacetate aluminum diisopropylate, aluminum monoacetylacetonate bis(ethylacetoacetate), and aluminum tris(acetylacetoacetate).

Examples of the zirconate coupling agent include tetra-n-propoxy zirconium, tetra-butoxy zirconium, zirconium tetraacetyl acetonate, zirconium dibutoxy bis(acetylacetonate), zirconium tributoxyethyl acetoacetate, and zirconium butoxy acetylacetonate bis(ethylacetoacetate).

Examples of the tin coupling agent include tin halide compounds. For example, dichlorotin, monomethyldichlorotin, dimethyldichlorotin, monoethyldichlorotin, diethyldichlorotin, methyltrichlorotin, monobutyldichlorotin, dibutyldibromotin, monohexyldichlorotin, or tetrachlorotin is used.

In addition, the liquid composition of the present invention may contain an acid or a base. In this case, the acid is preferably at least one selected from the group consisting of hydrogen chloride, sulfuric acid, perchloric acid, a sulfonic acid represented by General Formula [3] and an anhydride thereof, a carboxylic acid represented by General Formula [4] and an anhydride thereof, an alkyl borate ester, an aryl borate ester, tris(trifluoroacetoxy)boron, trialkoxy boroxine, trifluoroboron, and a silane compound represented by General Formula [5].

$$R^2S(O)_2OH \qquad [3]$$

In the formulas, R$^2$ is a monovalent hydrocarbon group having 1 to 18 carbon atoms in which some or all of the hydrogen atoms may be substituted by fluorine atoms.

$$R^3COOH \qquad [4]$$

In the formula, R$^3$ is a monovalent hydrocarbon group having 1 to 18 carbon atoms in which some or all of the hydrogen atoms may be substituted by fluorine atoms.

$$(R^4)_cSi(H)_dX^2_{4-c-d} \qquad [5]$$

In the formula,

R$^4$ is a monovalent hydrocarbon group having 1 to 18 carbon atoms in which some or all of the hydrogen atoms may be substituted by fluorine atoms. In the case where there are a plurality of R$^4$'s, the R$^4$'s may be the same or different.

X$^2$ represents at least one group selected from the group consisting of a chloro atom, —OCO—R$^5$ (where R$^5$ is a monovalent hydrocarbon group having 1 to 18 carbon atoms in which some or all of the hydrogen atoms may be substituted by fluorine atoms), and —OS(O)$_2$-R$^6$ (where R$^6$ is a monovalent hydrocarbon group having 1 to 18 carbon atoms in which some or all of the hydrogen atoms may be substituted by fluorine atoms). In the case where there are a plurality of X$^2$'s, the X$^2$'s may be the same or different.

c is an integer of 1 to 3, d is an integer of 0 to 2, and the sum of c and d is 1 to 3.

Examples of the sulfonic acid represented by General Formula [3] and the anhydride thereof include methanesulfonic acid, benzenesulfonic acid, p-toluenesulfonic acid, trifluoromethanesulfonic acid, and trifluoromethanesulfonic acid anhydride. Examples of the carboxylic acid represented by General Formula [3] and the anhydride thereof include acetic acid, trifluoroacetic acid, pentafluoropropionic acid, acetic anhydride, trifluoroacetic anhydride, and pentafluoropropionic anhydride. The silane compound represented by General Formula [4] is preferably chlorosilane, alkylsilylalkylsulfonate, or alkylsilylester, examples of which include trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate, and decyldimethylsilyl trifluoromethanesulfonate.

In addition, the base is preferably at least one selected from the group consisting of ammonia, N,N,N',N'-tetramethylethylenediamine, triethylenediamine, dimethylaniline, alkylamine, dialkylamine, trialkylamine, pyridine, piperazine, N-alkylmorpholine, and a silane compound represented by General Formula [6].

$$(R^7)_eSi(H)_fX^3_{4-e-f} \qquad [6]$$

In the formula,

R[7] is a monovalent hydrocarbon group having 1 to 18 carbon atoms in which some or all of the hydrogen atoms may be substituted by fluorine atoms. In the case where there are a plurality of R[7]'s, the R[7]'s may be the same or different.

X[3] is a monovalent substituent in which the atom bonded to the silicon atom is a nitrogen atom and which may contain a fluorine atom or a silicon atom. In the case where there are a plurality of X[3]'s, the X[3]'s may be the same or different.

e is an integer of 1 to 3, f is an integer of 0 to 2, and the sum of e and f is 1 to 3.

In the case where the surface treatment agent contained in the liquid composition of the present invention is a silylating agent, since the reaction between the silylating agent and the silanol group which is a reaction site on the surface of the concavo-convex pattern of the silicon wafer is accelerated by the above-mentioned acid or base, it is possible to impart excellent water repellency to the wafer surface by surface treatment with the liquid composition of the present invention. The acid or base may form part of the protective film.

Considering the reaction-accelerating effect, it is preferred that an acid is contained in the above liquid composition, among which particularly preferred is a Brønsted acid of a strong acid such as hydrogen chloride or perchloric acid; an alkanesulfonic acid or an acid anhydride thereof in which some or all of the hydrogen atoms are substituted by fluorine atoms, such as trifluoromethanesulfonic acid or trifluoromethanesulfonic anhydride; a carboxylic acid or an acid anhydride thereof in which some or all of the hydrogen atoms are substituted by fluorine atoms, such as trifluoroacetic acid, trifluoroacetic anhydride, or pentafluoropropionic acid; chlorosilane; alkylsilylalkylsulfonate in which some or all of the hydrogen atoms are substituted by fluorine atoms; or alkylsilyl ester in which some or all of the hydrogen atoms are substituted by fluorine atoms. Incidentally, the alkylsilyl ester is one in which an alkyl group and an —O—CO—R' group (where R' is an alkyl group) are bonded to a silicon element. The acid that may be contained in the liquid composition may be an acid produced by a reaction. For example, a chemical liquid for forming a protective film, which involves reaction of an alkylchlorosilane with an alcohol, uses the produced alkylalkoxysilane as a silylating agent, the produced hydrochloric acid as an acid, and the alcohol not consumed in the reaction as a non-aqueous organic solvent, may be obtained.

In one embodiment of the present invention, the content of the surface treatment agent is preferably 0.1% to 20% by mass with respect to the total mass of the liquid composition, and in the case of containing an acid or a base, the content of the surface treatment agent is preferably 0.0001% to 4% by mass with respect to the total mass of the liquid composition.

As the liquid composition of the present invention, for example, it is preferable to use a liquid composition containing a mixture consisting of 76% to 99.8999% by mass of at least one or more non-aqueous organic solvents selected from the group consisting of hydrofluoroether, hydrochlorofluorocarbon, a derivative of polyhydric alcohol having no OH group, and a lactone-based solvent, 0.1% to 20% by mass of at least one or more silylating agents having $C_xH_{2x+1}$ group (where x=1 to 12) or $C_yF_{2y+1}CH_2CH_2$ group (where y=1 to 8) selected from the group consisting of alkoxysilane, trimethyldimethylaminosilane, trimethyldiethylaminosilane, butyldimethyl(dimethylamino)silane, butyldimethyl(diethylamino)silane, hexyldimethyl(dimethylamino)silane, hexyldimethyl(diethylamino)silane, octyldimethyl(dimethylamino)silane, octyldimethyl(diethylamino)silane, decyldimethyl(dimethylamino)silane, decyldimethyl(diethylamino)silane, dodecyldimethyl(dimethylamino)silane, and dodecyldimethyl(diethylamino)silane, and 0.0001% to 4% by mass of at least one or more acids selected from the group consisting of trifluoroacetic acid, trifluoroacetic anhydride, trifluoromethanesulfonic acid, trifluoromethanesulfonic anhydride, trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate, and decyldimethylsilyl trifluoromethanesulfonate, or a liquid composition consisting only of the mixture.

In addition, for example, it is preferable to use a liquid composition containing a mixture consisting of 76% to 99.8999% by mass of at least one or more non-aqueous organic solvents selected from the group consisting of hydrofluoroether, hydrochlorofluorocarbon, and a derivative of polyhydric alcohol having no OH group, 0.1% to 20% by mass of at least one or more silylating agents selected from the group consisting of hexamethyl disilazane, tetramethyl disilazane, 1,3-dibutyl tetramethyl disilazane, 1,3-dihexyl tetramethyl disilazane, 1,3-dioctyl tetramethyl disilazane, 1,3-didecyl tetramethyl disilazane, and 1,3-didodecyl tetramethyl disilazane, and 0.0001% to 4% by mass of at least one or more acids selected from the group consisting of trifluoroacetic acid, trifluoroacetic anhydride, trifluoromethanesulfonic acid, trifluoromethanesulfonic anhydride, trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate, and decyldimethylsilyl trifluoromethanesulfonate, or a liquid composition consisting only of the mixture.

In another embodiment, it is preferred that the liquid composition of the present invention contains one or two or more metal atoms selected from metal species consisting of Cu, Fe, and Zn, in which a total content of the particulate metals including at least one of the metal atoms is 0.01 to 100 ppt (parts per trillion) by mass based on the total mass of the liquid composition.

A metal element selected from metal species consisting of Cu, Fe, and Zn (hereinafter, also referred to as "target metal" or the like) is contained as an impurity in the liquid composition. In the case where the liquid composition of the present invention is used as a surface treatment liquid in a semiconductor manufacturing process, particles containing these metal elements become defects which, in turn, greatly affect the formation of fine resist patterns and fine semiconductor elements. For this reason, it was considered that, as the amount of metal atoms contained in the liquid composition is smaller, the occurrence of defects in semiconductor manufacturing is reduced, which is therefore satisfactory. However, the present inventors have found that the amount of metal atoms contained in the liquid composition does not necessarily correlate with the occurrence rate of defects, and there is variation in the occurrence rate of defects.

Meanwhile, according to recently developed Single-Particle ICP-MS (SP-ICP-MS) measurement, it became possible to measure the amount of metal atoms present in the solution separately in terms of ionic metal and particulate metal (non-ionic metal), respectively. Here, the particulate metal (non-ionic metal) is a metal component that does not dissolve in the solution but exists as a solid.

Heretofore, the amount of metal atoms contained in a liquid composition has been usually analyzed by an ICP-MS method, and depending on ICP-MS, it is impossible to distinguish between the ionic metal containing at least one metal atom and the particulate metal (non-ionic metal), whereby quantification is made in terms of total mass of metal atoms, that is, total mass of ionic metal and particulate metal (non-ionic metal) (hereinafter, also referred to as "total metal amount" or the like).

As a result of extensive studies for an effect of each of the metal atom-derived ionic metal and the particulate metal (non-ionic metal) contained in a liquid composition, which can be identified and quantified by the SP-ICP-MS (Single-Particle ICP-MS) measurement, on defects, the present inventors have found that the effect of the amount of the particulate (non-ionic) metal is extremely large for the occurrence of defects, and there is a correlation between the amount of particulate (non-ionic) metal and the defect occurrence.

The preferred content of the particulate metal is based on such new findings and the content of the particulate metal in the liquid composition of the present invention is more preferably 0.01 to 50 ppt by mass and still more preferably 0.01 to 10 ppt by mass.

[Filtering]

The liquid composition of the present invention is preferably filtered with a filter for the purpose of removing foreign materials or reducing defects. Any filter may be used without particular limitation as long as it is conventionally used for filtration or the like. For example, the filter may be a filter made of a fluororesin such as polytetrafluoroethylene (PTFE), a polyamide-based resin such as nylon, a polyolefin resin such as polyethylene or polypropylene (PP) (including ones having a high density and an ultra-high molecular weight), or the like. Among these materials, preferred are polypropylene (including high-density polypropylene) and nylon. The pore size of the filter is suitably about 0.001 to 1.0 µm, preferably about 0.02 to 0.5 µm, and more preferably about 0.01 to 0.1 µm. By specifying the pore size of the filter to be this range, it becomes possible to reliably remove fine foreign materials such as impurities and aggregates contained in the treatment liquid, while suppressing clogging of the filter.

In the use of filter, different filters may be used in combination. In that case, filtering by a first filter may be carried out only once or two or more times. In a case of filtering two or more times by combining different filters, pore size for a second or subsequent filtering is preferably made larger than or equal to that for a first filtering. In addition, first filters having a different pore size in the above-mentioned range may be used in combination. The pore size herein can be set by referring to nominal values of filter manufacturers. Commercially available filters can be selected from various filters supplied by, for example, Nihon Pall Ltd., Advantec Toyo Kaisha, Ltd., Nihon Entegris K.K (formerly Nihon Mykrolis K.K.) or Kitz Micro Filter Corporation.

As the second filter, it is possible to use a filter formed of the same material or the like as the first filter. The pore size of the second filter is suitably about 0.01 to 1.0 µm and preferably about 0.1 to 0.5 µm. By specifying the pore size of the filter to be in this range, in the case where component particles are contained in the treatment liquid, it is possible to remove foreign materials incorporated in the treatment liquid while these component particles remain.

For example, the filtering with the first filter is carried out with a mixed liquid containing a part of the components of the treatment liquid, and the remaining components are mixed therewith to prepare a treatment liquid which may be then subjected to the second filtering. In addition, it is preferred that the filter to be used is treated prior to filtering the treatment liquid. The liquid used for this treatment is not particularly limited, but it is preferred that the metal content in the liquid is less than 0.001 ppt (parts per trillion) by mass. In addition to the above-mentioned water, as long as the liquid used for this treatment is a liquid in which other organic solvents are purified so that the metal content is within the above range, or a treatment liquid itself of the present invention, a diluted treatment liquid of the present invention, or a liquid containing a compound added to the treatment liquid of the present invention, the desired effect of the present application is significantly obtained.

[Method of Adjusting Metal Content]

In the liquid composition of the present invention, the ion concentration of each of Na, Ca, Al, Cr, Co, Pb, Li, Mg, Mn, Ni, K, Ag, and the like is preferably 1 ppm (parts per million) or less and more preferably 1 ppb (parts per billion) or less. In particular, the metal ion concentration is more preferably in the order of ppt (all the above concentrations are based on mass), and it is particularly preferred that the metal ions are substantially not included.

The adjustment of the metal content in the liquid composition of the present invention may be carried out, for example, in at least one stage of the stage of the raw material used in producing the liquid composition or the stage after preparation of the treatment liquid by repeatedly repeating distillation, filter filtration, filtration using an ion exchange resin, adsorption purification, or the like to sufficiently purify the liquid composition.

Here, the method of adjusting a metal content (hereinafter, also referred to as "metal concentration reduction method") is not particularly limited, but adsorption purification using silicon carbide described in WO12/043496A and the like can be mentioned. In addition, an example of carrying out sufficient purification through combinations of distillation, filter filtration, and filtration using an ion exchange resin is mentioned as a preferable embodiment.

From the viewpoint of obtaining the effect of the present invention, the method of adjusting the metal content is particularly preferably carried out at the stage of the raw material used in producing the liquid composition. In addition, as the raw material, it is preferable to use a raw material of a grade reduced in a specific metal atom or an inorganic ion such as sulfate ion, chloride ion, or nitrate ion and a specific metal ion.

As another method related to the metal concentration reduction method, use of a container with less elution of impurities can be mentioned, as described with respect to the storage container for storing a liquid composition of the present invention to be described later, as a "container" for storing the raw material used for producing the liquid composition. In addition, a method of lining the inner wall of the piping with a fluorine-based resin so as not to elute the metal component from "piping" or the like at the time of preparing the treatment liquid may also be mentioned.

[Impurities and Coarse Particles]

Also, it is preferred that the liquid composition of the present invention does not substantially contain coarse particles.

The coarse particles contained in the liquid composition refer to coarse particles which are particles such as dust, dirt, organic solid or inorganic solid contained as impurities in the raw material, or particles such as dust, dirt, organic solid or inorganic solid brought as contaminants during the preparation of the treatment liquid, and finally not dissolved and present as particles in the treatment liquid. The amount of coarse particles present in the treatment liquid can be measured in a liquid phase by using a commercially available measurement apparatus in a light scattering type in-liquid particle measuring method using a laser as a light source.

The liquid composition of the present invention is preserved in a state of being stored in a storage container described below.

<Storage Container Storing Liquid Composition>

The present invention relates to a storage container including a storage portion storing the liquid composition of the present invention (hereinafter, also referred to as "storage container of the present invention"). The first feature of the storage container of the present invention is that at least the portion where the liquid composition of the present invention is in contact with the inner wall of the storage portion (hereinafter, also referred to as "contact portion") has a contact angle θ with respect to water of 10 degrees or more and 150 degrees or less. In the case where the liquid composition of the present invention is filled and stored in such a storage container, deterioration of performance such as water repellency can be suppressed.

Here, the "contact angle" is an index relating to the wettability of a surface of a certain substance to a certain liquid, and as shown in FIG. 1, is represented by an angle θ formed by the tangent at the peripheral portion of a liquid 11 adhering to a substance (inner wall of the storage portion) 10 with respect to the surface of the substance 10. Therefore, as the contact angle θ is larger, the substance 10 is more likely to repel the liquid 11, and therefore the wettability to the liquid 11 is low. Conversely, as the contact angle θ is smaller, the substance 10 is less likely to repel the liquid 11 and therefore the wettability to the liquid 11 is high. The magnitude of the contact angle θ depends on the magnitude of the surface energy, and the contact angle θ increases as the surface energy decreases.

The contact angle in the present invention is a value measured by a θ/2 method described in the following Examples.

In addition, the term "water" as used herein refers to ultrapure water, and it is preferably high-grade water used for semiconductor manufacturing. For example, ultrapure water having a content of each of Fe, Cu, and Zn of less than 10 ppt by mass like the water used in the Examples is preferable.

In the present invention, it is preferred that at least the portion where the liquid composition of the present invention is in contact with the inner wall of the storage portion has a contact angle θ with respect to water of 10 degrees or more and 150 degrees or less, preferably 50 degrees or more and 125 degrees or less, and more preferably 70 degrees or more and 115 degrees or less as described above.

A smaller value of the contact angle θ shows that the inner wall of the storage portion is more likely to get wet with water. In the case where the contact angle θ is 10 degrees or more, it is presumed that the inner wall of the storage portion has a small interaction with water, so that moisture is less likely to be adsorbed and even in the case where the moisture is adsorbed, the moisture desorbs easily. In other words, it is inferred that moisture is hard to be retained. Therefore, there is almost no moisture to be brought into the liquid composition from the inner wall of the storage portion, and deterioration of performance such as water repellency due to water being incorporated into the liquid composition during storage can be suppressed. From the above viewpoint, the contact angle θ is 10 degrees or more, preferably 50 degrees or more, and particularly preferably 70 degrees or more.

On the other hand, the container of the present invention is required to have durability in the case where the container is repeatedly used (in the case where it is used for recycling). In the case where the contact angle θ is 150 degrees or less, physical changes such as abrasion and peeling, chemical changes such as corrosion and chemical reaction, and other changes due to adsorption of contaminants on the inner wall surface of the storage portion in the case where the container is used repeatedly are suppressed, and therefore the durability is remarkably excellent. From the above viewpoint, the contact angle θ is 150 degrees or less, preferably 125 degrees or less, and particularly preferably 115 degrees or less.

In one embodiment of the present invention, the portion of the inner wall of the storage portion in contact with the liquid composition of the present invention has a contact angle difference $|\theta_B-\theta_A|$ of preferably 3 degrees or more and preferably 15 degrees or less in the case where a contact angle with respect to water after contact with the liquid composition of the present invention is taken as $\theta_B$ and a contact angle with respect to water before contact with the liquid composition is taken as $\theta_A$.

Here, the contact angle difference $|\theta_B-\theta_A|$ means the difference in contact angle with respect to water before and after contact with the liquid composition of the present invention. That is, the contact angle $\theta_B$ refers to a contact angle with respect to water at the site after contacting with the liquid composition of the present invention and then washing, and the contact angle $\theta_A$ refers to refers to a contact angle with respect to water at the site before contacting with the liquid composition in order to measure the contact angle $\theta_B$. Specifically, it is a contact angle measured by the measuring method described in the following Examples.

The contact angle difference $|\theta_B-\theta_A|$ is caused by the amount of the surface treatment agent adsorbed on the inner wall of the storage portion. The large value of this difference means that the amount of the surface treatment agents adsorbed to the inner wall of the storage portion is large, which thus results in poor temporal stability (storage stability). The contact angle difference $|\theta_B-\theta_A|$ of 15 degrees or less is preferable from the viewpoint of suppressing deterioration of the surface modification effect of the liquid composition such as water repellency due to decrease in the concentration of the surface treatment agent in the liquid composition during storage. The contact angle difference $|\theta_B-\theta_A|$ is more preferably 10 degrees or less and still more preferably 7 degrees or less.

The small contact angle difference $|\theta_B-\theta_A|$ is preferable from the viewpoint of temporal stability (storage stability) because there is no decrease in the concentration of the surface treatment agent due to storage from the above reason. However, in the case of using the container around, there is a case where the surface treatment agent adheres to some extent so that hydrophobicity is maintained, which is effective in suppressing chemical and physical changes on the surface such as corrosion. Therefore, from the viewpoint of the recyclability of the container, the contact angle difference $|\theta_B-\theta_A|$ is preferably 3 degrees or more, more preferably 4 degrees or more, and still more preferably 5 degrees or more.

In addition, in one embodiment of the present invention, it is preferred that at least the portion of the inner wall of the storage portion in contact with the liquid composition of the present invention has good wettability, so that the contact angle $\theta_C$ with respect to the liquid composition of the present invention is preferably less than 90 degrees. This contact site has a contact angle $\theta_C$ with respect to the liquid composition of the present invention of more preferably 75 degrees or less and still more preferably 25 degrees or less. In addition, although it is ideal that this contact site has a contact angle $\theta_C$ with respect to the liquid composition of the present invention of 0 degrees or more, the contact angle $\theta_C$ may be not less than the measurement limit value.

The value of the contact angle $\theta_C$ indicates that the inner wall of the storage portion is likely to get wet with a non-aqueous organic solvent, in other words, the inner wall of the storage portion is hydrophobic. In this case, it is presumed that the inner wall of the storage portion has a small interaction with water, so that moisture is less likely to be adsorbed and even in the case where moisture is adsorbed, the moisture desorbs easily. In other words, it is inferred that moisture is hard to be retained. Therefore, since there is almost no moisture to be brought into the liquid composition from the inner wall of the storage portion, deterioration of performance such as water repellency due to water being incorporated into the liquid composition during storage can be suppressed.

In one embodiment, the storage container of the present invention includes a storage portion in which the treatment liquid of the present invention is stored, and a seal portion for sealing the storage portion.

In one embodiment of the present invention, the inner wall of the storage portion in contact with the treatment liquid of the present invention is preferably at least partially formed of a material containing at least one selected from polyethylene, polypropylene, polytetrafluoroethylene, or perfluoroalkoxy alkane. Here, the phrase "at least partially" means that, for example, a lining used for the inner wall of the storage portion, a lining layer, a laminate layer, a sealing material used for the joining portion, a lid, an observation window, or the like may be formed of other materials.

In another embodiment of the present invention, the inner wall of the storage portion in contact with the treatment liquid of the present invention is preferably at least partially formed of a material containing at least one selected from stainless steel, Hastelloy, Inconel, or Monel. Here, the phrase "at least partially" means that, for example, a lining used for the inner wall of the storage portion, a lining layer, a laminate layer, a sealing material used for the joining portion, a lid, an observation window, or the like may be formed of other materials.

In one embodiment of the storage container of the present invention, the percentage of voids (hereinafter, also referred to as "void volume") occupying in the storage portion storing the liquid composition of the present invention is preferably 40% to 0.01% by volume. By setting the upper limit value of the void volume in the storage portion to 40% by volume or less, it is possible to reduce the possibility that impurities and moisture contained in the gas occupying the voids are incorporated into the treatment liquid of the present invention. In one embodiment, the void volume in the storage portion is more preferably 35% to 1% by volume and still more preferably 30% to 5% by volume.

In one embodiment of the storage container of the present invention, it is preferred that the moisture concentration in the gas occupying the voids of the storage portion storing the liquid composition of the present invention is 0.01 ppt by mass to 1 ppm by mass. The moisture concentration is more preferably 0.01 ppt by mass to 50 ppb by mass and still more preferably 0.01 ppt by mass to 1 ppb by mass. In the case where the moisture concentration in the gas occupying the voids is within the above range, almost no moisture is brought into the liquid composition from the voids of the storage portion, so that deterioration of performance such as water repellency due to water being incorporated into the liquid composition during storage can be suppressed.

As described above, in one embodiment, the liquid composition of the present invention is used for forming a water-repellent protective film on a wafer having a concavo-convex pattern on the surface thereof. The wafer having a concavo-convex pattern on the surface thereof is often obtained by the following procedure. First, a resist is applied to the surface of a smooth wafer, the resist is exposed through a resist mask, and the exposed resist portion or the unexposed resist portion is removed by etching to prepare a resist having a desired concavo-convex pattern. In addition, a resist having a concavo-convex pattern can also be obtained by pressing a mold having a pattern against a resist. Next, the wafer is etched. At this time, the concave portion of the resist pattern is selectively etched. Finally, in the case where the resist is peeled off, a wafer having a concavo-convex pattern is obtained.

The wafer having a concavo-convex pattern on the surface thereof is preferably, for example, a wafer in which at least a portion of the concavo-convex pattern contains a silicon element. Such a wafer encompasses a wafer in which a layer containing silicon such as silicon, polysilicon, amorphous silicon, silicon oxide, or silicon nitride or a layer containing germanium (Ge) or a low dielectric constant material having a dielectric constant (k value) of 2.4 or less is formed on the wafer surface; and a wafer in which, in the case where the concavo-convex pattern is formed, at least a portion of the surface of the concavo-convex pattern contains a silicon element such as silicon, polysilicon, amorphous silicon, silicon oxide, or silicon nitride, or contains germanium (Ge) or a low dielectric constant material having a k value of 2.4 or less.

The wafer having a concavo-convex pattern on the surface thereof may be a wafer consisting of a plurality of layers. In the case where the wafer consists of a plurality of layers, at least one layer is preferably a layer containing silicon such as silicon, polysilicon, amorphous silicon, silicon oxide, or silicon nitride, or a layer containing germanium (Ge) or a low dielectric constant material having a dielectric constant (k value) of 2.4 or less.

The material containing Ge is not limited to a material consisting only of Ge but may be a composite compound material of Ge and Si, for example. Specifically, $Si_{0.5}Ge_{0.5}$, $Si_{0.15}Ge_{0.85}$, and the like can be mentioned.

The low dielectric constant material having a k value of 2.4 or less may be, for example, BDIII (Low-k) material manufactured by Advanced Materials Technology, Inc. The k value can be measured by, for example, a CMmap 92B (product name) manufactured by Four Dimensions, Inc. (http://www.oyama-web.com/guide4/sub25.htm).

In addition, even for the wafer constituted of a plurality of components including at least one selected from silicon, polysilicon, amorphous silicon, silicon oxide, silicon nitride, a material containing Ge, or a low dielectric constant material having a k value of 2.4 or less, it is possible to form a protective film on the surface thereof. The wafer constituted of these plural components also encompasses a wafer in which at least one selected from silicon, polysilicon, amorphous silicon, silicon oxide, silicon nitride, a material containing Ge, or a low dielectric constant material having a k value of 2.4 or less is exposed to the wafer surface; and a wafer in which, in the case where a concavo-convex pattern is formed by etching or the like, at least one selected from silicon, polysilicon, amorphous silicon, silicon oxide, silicon nitride, a material containing Ge, or a low dielectric constant material having a k value of 2.4 or less is exposed to at least a portion of the surface of the concavo-convex pattern. In the case where the liquid composition of the present invention is used, a protective film is likely to be formed on the surface of the portion containing the material in the concavo-convex pattern.

The formation of a water-repellent protective film on the surface of the concave portion of the wafer is achieved in such a manner that, in the case where the present invention contains a silane compound as a surface treatment agent, the reactive site of the silane compound reacts with the silanol group which is a reaction site of the wafer, and the silane compound chemically bonds with the silicon element of the silicon wafer through a siloxane bond. The reactive site may be decomposed or denatured by water and the reactivity thereof may be lowered in some cases. Therefore, it is necessary to reduce the contact with water of the silane compound as a surface treatment agent.

EXAMPLES

Hereinafter, the present invention will be described in detail with reference to Examples, but the content of the present invention is not limited thereto.

In the following Examples, preparation, filling, storage, analysis, and measurement of treatment liquids were all carried out in a clean room having a level satisfying ISO Class 2 or less.

Further, the ultrapure water to be used below was used for the preparation of treatment liquids after purifying by the method described in JP2007-254168A to confirm that the content of each of Fe, Cu, and Zn was less than 10 ppt by mass with respect to the total mass of each treatment liquid.

For the organic solvent to be used below, a semiconductor grade solvent for use in semiconductor manufacturing was used after being purified using a distillation column whose inner wall was made of glass. Purification of the organic solvent was repeated until the content of each of Fe, Cu, and Zn in each treatment liquid finally obtained was less than 10 ppt by mass with respect to the total mass of each treatment liquid.

<Preparation and Storage of Liquid Composition>

[Preparation of Treatment Liquid A]

As a dehydration step, hydrofluoroether (HFE-7100 manufactured by 3M Company), which is an organic solvent which is flame-retardant and does not contain an OH group, was subjected to moisture removal using a MOLECULAR SIEVE 3A (manufactured by Union Showa K.K.). The moisture content of the moisture-removed HFE-7100 was measured with a Karl Fischer moisture meter (MKC-610-DT, manufactured by Kyoto Electronics Manufacturing Co., Ltd.) and found to be 30 ppm by mass.

Next, as a mixing step, 3 g of trimethylmethoxysilane $[(CH_3)_3SiOCH_3]$ as a silane compound, 1 g of trifluoromethanesulfonic acid $[CF_3SO_3H]$ as an acid, and 96 g of HFE-7100 subjected to moisture removal as described above as a non-aqueous organic solvent were mixed to obtain treatment liquid A shown in Table 1. The dehydration step and mixing step were carried out in an inert atmosphere having a dew point temperature of −70° C. or lower.

[Preparation of Treatment Liquids B to M]

Treatment liquids B to F and H to M shown in Table 1 were prepared according to the above-described method for preparing treatment liquid A. In addition, treatment liquid G using an organic solvent not subjected to moisture removal was prepared.

[Preparation of Treatment Liquids B-1 to B-11]

Treatment liquids B-1 to B-11 shown in Table 5 were prepared in order to evaluate the effect of the content of particulate metals derived from metallic impurities (Cu, Fe, and Zn) contained in the treatment liquid. The treatment liquids B-1 to B-11 were prepared by changing the organic solvent, propylene glycol monomethyl ether acetate (PGMEA) to PGMEA having different degrees of purification, for the treatment liquid B shown in Table 1. The degree of purification of PGMEA was adjusted by mixing PGMEA after purification used in treatment liquid B with PGMEA before purification at a certain ratio.

TABLE 1

| Treatment liquid | Surface treatment agent Type | Content (% by mass) | Acid or base Type | Content (% by mass) |
|---|---|---|---|---|
| Treatment liquid A | Trimethylmethoxysilane $[(CH_3)_3SiOCH_3]$ | 4 | Trifluoromethanesulfonic acid $[CF_3SO_3H]$ | 1 |
| Treatment liquid B | Hexamethyldisilazane $[(CH_3)_3Si-NH(Si(CH_3)_3)]$ | 5 | Trifluoroacetic anhydride $[(CF_3CO)_2O]$ | 0.1 |
| Treatment liquid C | Hexamethyldisilazane $[(CH_3)_3Si-NH(Si(CH_3)_3)]$ | 5 | Trifluoroacetic anhydride $[(CF_3CO)_2O]$ | 0.4 |
| Treatment liquid D | Hexamethyldisilazane $[(CH_3)_3Si-NH(Si(CH_3)_3)]$ | 6 | Trifluoroacetic anhydride $[(CF_3CO)_2O]$ | 0.5 |
| Treatment liquid E | Trimethylchlorosilane $[(CH_3)_3SiCl]$ | 10 | None | — |
| Treatment liquid F | Hexamethyldisilazane $[(CH_3)_3Si-NH(Si(CH_3)_3)]$ | 5 | Trifluoroacetic anhydride $[(CF_3CO)_2O]$ | 0.1 |
| Treatment liquid G | Hexamethyldisilazane $[(CH_3)_3Si-NH(Si(CH_3)_3)]$ | 5 | Trifluoroacetic anhydride $[(CF_3CO)_2O]$ | 0.1 |
| Treatment liquid H | Trifluoropropylmethoxysilane | 5 | Trifluoroacetic anhydride $[(CF_3CO)_2O]$ | 0.1 |
| Treatment liquid I | Perfluorodecyltrimethoxysilane | 5 | Trifluoroacetic anhydride $[(CF_3CO)_2O]$ | 0.1 |

TABLE 1-continued

| Treatment liquid | | | | | | |
|---|---|---|---|---|---|---|
| Treatment liquid J | Perfluorodecyltrimethoxysilane | | 5 | Trifluoroacetic anhydride [(CF$_3$CO)$_2$O] | | 0.1 |
| Treatment liquid K | Aminopropyltrimethoxysilane | | 5 | Trifluoroacetic anhydride [(CF$_3$CO)$_2$O] | | 0.1 |
| Treatment liquid L | Alkyl acetoacetate aluminum diisopropylate | | 5 | Trifluoroacetic anhydride [(CF$_3$CO)$_2$O] | | 0.1 |
| Treatment liquid M | PLENACT 38S (Titanate-based coupling agent) | | 5 | Trifluoroacetic anhydride [(CF$_3$CO)$_2$O] | | 0.1 |

| | Organic solvent | | | |
|---|---|---|---|---|
| Treatment liquid | Type | Dehydration step | Moisture concentration in organic solvent after dehydration (ppm by mass) | Content of organic solvent (% by mass) |
| Treatment liquid A | HFE-7100 | MOLECULAR SIEVE 3A (manufactured by Union Showa K. K.) | 30 | 95 |
| Treatment liquid B | PGMEA | ZEOLUM 4A (manufactured by Tosoh Corporation) | 33 | 94.9 |
| Treatment liquid C | PGMEA | Silica gel (manufactured by Kanto Chemical Co., Inc.) | 68 | 94.6 |
| Treatment liquid D | PGMEA | Soda lime (manufactured by Central Glass Co., Ltd.) | 95 | 93.5 |
| Treatment liquid E | IPA | MOLECULAR SIEVE 3A (manufactured by Union Showa K. K.) | 28 | 90 |
| Treatment liquid F | PGMEA | Soda lime (manufactured by Central Glass Co., Ltd.) | 115 | 94.9 |
| Treatment liquid G | PGMEA | None | 342 | 94.9 |
| Treatment liquid H | PGMEA | ZEOLUM 4A (manufactured by Tosoh Corporation) | 36 | 94.9 |
| Treatment liquid I | PGMEA | ZEOLUM 4A (manufactured by Tosoh Corporation) | 35 | 94.9 |
| Treatment liquid J | PGMEA | ZEOLUM 4A (manufactured by Tosoh Corporation) | 32 | 94.9 |
| Treatment liquid K | PGMEA | ZEOLUM 4A (manufactured by Tosoh Corporation) | 32 | 94.9 |
| Treatment liquid L | PGMEA | ZEOLUM 4A (manufactured by Tosoh Corporation) | 40 | 94.9 |
| Treatment liquid M | PGMEA | ZEOLUM 4A (manufactured by Tosoh Corporation) | 42 | 94.9 |

[Organic Solvent]

PGMEA: Propylene glycol monomethyl ether acetate

IPA: Isopropyl alcohol

<Storage>

Each of the obtained treatment liquids was filled in the storage portion of the storage container described in Tables 2 to 5. In the case where each treatment liquid was filled in the storage container, the voids of the storage portion were filled with the filling gas described in each table.

[Storage Container]

The storage containers described in Tables 2 to 5 are as follows.

PE: A storage container in which the inner wall of the storage portion is made of polyethylene (PE).

PP: A storage container in which the inner wall of the storage portion is made of polypropylene (PP).

PTFE: A storage container in which the inner wall of the storage portion is made of polytetrafluoroethylene (PTFE).

PTFE coating: A storage container in which the inner wall of the storage portion is coated with PTFE.

PFA: A storage container in which the inner wall of the storage portion is made of perfluoroalkoxy alkane (PFA).

Electropolished stainless steel 1: A storage container in which the inner wall of the storage portion is made of electropolished stainless steel (SUS 316L).

Electropolished stainless steel 2: A storage container constructed by lowering the treatment current density in electropolishing with respect to electropolished stainless steel 1.

Electropolished stainless steel 3: A storage container constructed under the treatment current density condition between the treatment current density condition of electropolished stainless steel 1 and the treatment current density condition of electropolished stainless steel 2 by lowering the treatment current density in electropolishing with respect to electropolished stainless steel 1.

Electropolished stainless steel 4: A storage container constructed by lowering the treatment current density in electropolishing with respect to electropolished stainless steel 2.

Electropolished stainless steel 5: A storage container constructed by lowering the treatment current density in electropolishing with respect to electropolished stainless steel 4.

Buff polished stainless steel: A storage container in which the inner wall of the storage portion is made of buff polished stainless steel (SUS 316L).

Electropolished Hastelloy: A storage container in which the inner wall of the storage portion is made of electropolished Hastelloy.

Electropolished Inconel: A storage container in which the inner wall of the storage portion is made of electropolished Inconel.

Electropolished Monel: A storage container in which the inner wall of the storage portion is made of electropolished Monel.

Z-1: A storage container prepared by the method described in the Example (paragraph 0037) of JP2014-148332A. (storage container having a main body made of polyethylene terephthalate and a treated surface formed on the inner wall surface of the container main body by plasma etching treatment, and covered with a hydrophobic silicon film covering the treated surface).

Z-2: A storage container constructed by changing the plasma etching treatment time from 10 minutes (60 times in 10 seconds) to 8 minutes (48 times in 10 seconds) in the Example (paragraph 0037) of JP2014-148332A.

Z-3: A storage container constructed by changing the plasma etching treatment time from 10 minutes (60 times in 10 seconds) to 6 minutes (36 times in 10 seconds) in the Example (paragraph 0037) of JP2014-148332A.

[Filling Gas]

Nitrogen gas A: The moisture concentration is 0.01 ppm by mass/L

Nitrogen gas B: The moisture concentration is 0.5 ppm by mass/L

Nitrogen gas C: The moisture concentration is 10 ppm by mass/L

Argon gas: The moisture concentration is 1 ppm by mass/L

Atmosphere: The moisture concentration is more than 100 ppm by mass/L

[Void Volume (% by Volume)]

The internal volume of the storage portion was calculated from the amount of increase of the mass in the case where ultrapure water was filled at 100%. Adjustment of the void volume exceeding 1% was carried out by obtaining the mass of the solution to be filled from the volume of the solution having the desired void volume and the specific gravity of the solution and adjusting the filling amount by the amount of increase of the mass. Adjustment of a small amount of void volume of 1% or less was carried out by filling the solution at 100%, and then sucking a solution of an amount corresponding to the volume of the gas having the desired void volume with a clean dropper.

[Contact Angle $\theta$ of Inner Wall Member of Storage Portion with Respect to Water]

A test piece of the inner wall member of the container was prepared, washed with ultrapure water, further washed with IPA, and then thoroughly dried. About 2 µl of ultrapure water was placed on the surface of the test piece and the angle (contact angle) $\theta$ formed between the ultrapure water and the surface of the test piece was measured by a $\theta/2$ method using a contact angle meter ("DM-701" manufactured by Kyowa Interface Science Co., Ltd.). In the $\theta/2$ method, the radius r and the height h of the liquid 11 shown in FIG. 1 are obtained and substituted into the following equation.

$$\tan\theta_1 = h/r \rightarrow \theta = 2\arctan(h/r)$$

[Evaluation of Water Repellency of Treatment Liquid]

Wafers having a clean flat film for evaluation, each of which is made of SiC, $SiO_2$, or SiN, were prepared. In order to remove the natural oxide film, a pretreatment was carried out with 5% by mass of hydrofluoric acid (HF). A beaker test was carried out using the wafer after the pretreatment. Specifically, first, treatment liquids A to M shown in Table 1 were prepared, and each treatment liquid at room temperature was prepared in a beaker. While each treatment liquid in the beaker was stirred at 250 rpm, the wafer was immersed in each treatment liquid for 5 minutes. The wafers thus brought into contact with the respective treatment liquids were rinsed with isopropyl alcohol (IPA) at 40° C. for 30 seconds and dried with the nitrogen gas A. The temperature at the time of drying was 20° C. (room temperature).

About 2 µl of ultrapure water was placed on the surface of the wafer after treatment and the angle (contact angle $\alpha$) formed between the ultrapure water and the surface of the wafer after treatment was measured by a $\theta/2$ method using with a contact angle meter ("DM-701" manufactured by Kyowa Interface Science Co., Ltd.). A larger contact angle $\alpha$ exhibits higher water repellency.

A: The contact angle $\alpha$ is more than 85 degrees

B: The contact angle $\alpha$ is 75° or more and less than 85 degrees

C: The contact angle $\alpha$ is less than 75 degrees

[Evaluation of Storage Stability 1 of Treatment Liquid Preserved in Storage Container]

Each of the prepared treatment liquids was filled in each of storage containers shown in Tables 2 and 3, each of the treatment liquids was stored in a sealed state at 40° C. for 2 weeks, and then evaluation was carried out in the same manner as the above-mentioned water repellency evaluation using the treatment liquids after the storage. In the evaluation of Examples and Comparative Examples shown in Table 2, SiC wafers, $SiO^2$ wafers, and SiN wafers subjected to the same pretreatment as in the above-mentioned water repellency evaluation were used as the substrates, and in the evaluation of Examples shown in Table 3, SiN wafers subjected to the same pretreatment were used as the substrates.

Based on the following equation, the percentage change in contact angle $\alpha$ before storage and after storage was calculated and evaluated according to the following standards. The smaller the percentage change, the more the water repellent performance of the treatment liquid is maintained, so that the storage stability of the treatment liquid stored in the storage container is excellent.

Percentage change (%) of contact angle $\alpha$ after storage=((Contact angle $\alpha$ in water repellency evaluation before storage-contact angle $\alpha$ in water repellency evaluation after storage)/contact angle $\alpha$ in water repellency evaluation before storage)×100

A: The percentage change is within ±5%

B: The percentage change is more than ±5% and within ±10%

C: The percentage change is more than ±10% and within ±15%

D: The percentage change is more than ±15%

[Evaluation of Storage Stability 2 of Treatment Liquid Preserved in Storage Container]

Each of the prepared treatment liquids was filled in each of storage containers shown in Tables 4 and 5, each of the treatment liquids was stored in a sealed state at 50° C. for 30 days, and then evaluation was carried out in the same manner as the above-mentioned water repellency evaluation using the treatment liquids after the storage. In addition, SiN wafers subjected to the same pretreatment as in the above-mentioned water repellency evaluation were used as the substrates Based on the following equation, the percentage change in contact angle $\alpha$ before storage and after storage was calculated and evaluated according to the following standards. The smaller the percentage change, the more the water repellent performance of the treatment liquid is maintained, so that the storage stability of the treatment liquid stored in the storage container is excellent.

Percentage change (%) of contact angle $\alpha$ after storage=((Contact angle $\alpha$ in water repellency evaluation before storage−contact angle α in water repellency evaluation after storage)/contact angle α in water repellency evaluation before storage)×100

A: The percentage change is within ±5%
B: The percentage change is more than ±5% and within ±10%
C: The percentage change is more than ±10% and within ±15%
D: The percentage change is more than ±15%

[Evaluation of Recyclability of Container]

Each of the prepared treatment liquids was filled in each of storage containers shown in Tables 4 and 5, each of the treatment liquids was stored in a sealed state at 50° C. for 3 days, and then the treatment liquid was taken out and replaced by a new treatment liquid. This operation was repeated ten times, and the same evaluation as in the above-described water repellency evaluation was carried out using the treatment liquid after the 10th storage. SiN wafers subjected to the same pretreatment as in the above-mentioned water repellency evaluation were used as the substrates.

The percentage change in contact angle α after the 10th storage relative to contact angle α before storage was calculated and evaluated based on the following standards. The smaller the percentage change, the better the recyclability of the storage container, without deteriorating the storage performance of the treatment liquid even in the case where the container is repeatedly used.

Percentage change (%) of contact angle α after storage=((Contact angle α in water repellency evaluation before storage−contact angle α in water repellency evaluation after storage)/contact angle α in water repellency evaluation before storage)×100

A: The percentage change is within ±7%
B: The percentage change is more than ±7% and within ±14%
C: The percentage change is more than ±14% and within ±20%
D: The percentage change is more than ±20%

In the above standards, the evaluation C achieves a level required as a treatment liquid for forming a water-repellent protective film in a semiconductor manufacturing process.

[Measurement of Contact Angle Difference |θ$_B$−θ$_A$|]

A test piece of the inner wall member of the container was prepared, washed with ultrapure water, further washed with IPA, and then thoroughly dried. About 2 μl of ultrapure water was placed (added dropwise) on the surface of the test piece and the angle (contact angle) formed between the ultrapure water and the surface of the test piece was measured using a contact angle meter ("DM-701" manufactured by Kyowa Interface Science Co., Ltd.). The contact angle measured here was taken as θ$_A$.

Subsequently, a test piece not used for the above measurement was immersed in the prepared treatment liquid at 20° C. for 1 minute. Thereafter, the test piece was immersed in isopropanol (IPA) for 1 minute and then immersed in ultrapure water as an aqueous cleaning liquid for 1 minute. Finally, this test piece was taken out from the ultrapure water and sprayed with air to remove pure water on the surface thereof.

Then, about 2 μl of ultrapure water was placed on the surface of the test piece, and the angle (contact angle) formed between the ultrapure water and the surface of the test piece was measured by a θ/2 method using a contact angle meter ("DM-701" manufactured by Kyowa Interface Science Co., Ltd.). The contact angle measured here was taken as θ$_B$.

[Measurement of Contact Angle θ$_C$ of Inner Wall Member of Storage Portion with Respect to Treatment Liquid]

A test piece of the inner wall member of the container was prepared, washed with ultrapure water, further washed with IPA, and then thoroughly dried. About 2 μl of each treatment liquid was placed on the surface of the test piece and the angle (contact angle θ$_C$) formed between the each treatment liquid and the surface of the test piece was measured by a θ/2 method using a contact angle meter ("DM-701" manufactured by Kyowa Interface Science Co., Ltd.). The results are shown in Table 3.

[Measurement of Total Metal Content and Particulate Metal Content (SP-ICP-MS Method)]

The total metal content and the particulate metal content in the treatment liquid shown in Table 5 were measured by the following method. The results are shown in the same table.

1) Preparation of Standard Substance

Ultrapure water was weighed into a clean glass container and metal particles to be measured having a median diameter of 50 nm were added so as to have a concentration of 10,000 particles/ml, and then the dispersion liquid treated by an ultrasonic washing machine for 30 minutes was used as a standard substance for transport efficiency measurement.

2) The SP-ICP-MS Apparatus Used
Manufacturer: PerkinElmer, Inc.
Model: NexION 350S 3) Measurement Conditions of SP-ICP-MS SP-ICP-MS was carried out as follows. Using a PFA concentric nebulizer, a quartz cyclonic spray chamber, and a quartz torch injector having an inner diameter of 1 mm, a liquid to be measured was aspirated at a rate of about 0.2 mL/min. The oxygen addition amount was 0.1 L/min, the plasma output was 1600 W, and the cell was purged by an ammonia gas. The time resolution analysis was carried out at 50 μs.

The amount of ionic metal and the amount of particulate metal, and the total metal amount, which is the sum of the amount of ionic metal and the amount of particulate metal, were measured using the following analysis software attached to the manufacturer.

Amount of ionic metal and amount of particulate metal:
   Syngistix nano application module dedicated to nanoparticle analysis "SP-ICP-MS"
Total metal amount: Syngistix for ICP-MS software

TABLE 2

| | Treatment liquid | Storage portion inner wall (Filling gas: nitrogen gas A) | Contact angle θ (degrees) | Void volume (vol %) | Water repellency evaluation | | | Storage stability 1 | | | Recyclability of container |
|---|---|---|---|---|---|---|---|---|---|---|---|
| | | | | | SiC | SiO$_2$ | SiN | SiC | SiO$_2$ | SiN | |
| Example 1 | Treatment liquid A | Electropolished stainless steel 1 | 95 | 20 | A | A | A | A | A | A | A |
| Example 2 | Treatment liquid A | PE | 88 | 20 | A | A | A | A | A | A | A |
| Example 3 | Treatment liquid A | PP | 91 | 20 | A | A | A | A | A | A | A |

TABLE 2-continued

|  | Treatment liquid | Storage portion inner wall (Filling gas: nitrogen gas A) | Contact angle θ (degrees) | Void volume (vol %) | Water repellency evaluation SiC | SiO$_2$ | SiN | Storage stability 1 SiC | SiO$_2$ | SiN | Recyclability of container |
|---|---|---|---|---|---|---|---|---|---|---|---|
| Example 4 | Treatment liquid A | PTFE | 108 | 20 | A | A | A | A | A | A | A |
| Example 5 | Treatment liquid A | PFA | 73 | 20 | A | A | A | A | A | A | A |
| Example 6 | Treatment liquid A | Electropolished Inconel | 85 | 20 | A | A | A | A | A | A | A |
| Example 7 | Treatment liquid A | Electropolished Hastelloy | 85 | 20 | A | A | A | A | A | A | A |
| Example 8 | Treatment liquid A | Electropolished Monel | 85 | 20 | A | A | A | A | A | A | A |
| Example 9 | Treatment liquid A | Electropolished stainless steel 2 | 25 | 20 | B | B | B | C | C | C | C |
| Example 10 | Treatment liquid A | PTFE coating | 125 | 20 | A | A | A | B | B | B | B |
| Example 11 | Treatment liquid A | Buff polished stainless steel | 78 | 20 | A | A | A | A | A | A | A |
| Example 12 | Treatment liquid A | Z-2 | 145 | 20 | A | A | A | B | B | B | B |
| Example 13 | Treatment liquid A | Z-3 | 120 | 20 | A | A | A | A | A | A | A |
| Example 14 | Treatment liquid A | Electropolished stainless steel 1 | 95 | 0.00 | A | A | A | A | A | A | C |
| Example 15 | Treatment liquid A | Electropolished stainless steel 1 | 95 | 0.01 | A | A | A | A | A | A | B |
| Example 16 | Treatment liquid A | Electropolished stainless steel 1 | 95 | 1 | A | A | A | A | A | A | B |
| Example 17 | Treatment liquid A | Electropolished stainless steel 1 | 95 | 10 | A | A | A | A | A | A | A |
| Example 18 | Treatment liquid A | Electropolished stainless steel 1 | 95 | 30 | A | A | A | A | A | A | A |
| Example 19 | Treatment liquid A | Electropolished stainless steel 1 | 95 | 35 | A | A | A | B | B | B | A |
| Example 20 | Treatment liquid A | Electropolished stainless steel 1 | 95 | 45 | A | A | A | C | C | C | A |
| Example 21 | Treatment liquid A | Electropolished stainless steel 3 | 55 | 20 | A | A | B | A | A | B | B |
| Example 22 | Treatment liquid A | Electropolished stainless steel 4 | 15 | 20 | B | B | B | C | C | C | C |
| Comparative Example 1 | Treatment liquid A | Electropolished stainless steel 5 | 8 | 20 | C | C | C | D | D | D | D |
| Comparative Example 2 | Treatment liquid A | Z-1 | More than 150 | 20 | A | A | A | D | D | D | D |

TABLE 3

|  | Treatment liquid | Storage portion inner wall (Filling gas: nitrogen gas A) (Void volume: 20 vol %) | Contact angle θ$_A$ (degrees) | Contact angle θ$_B$ (degrees) | Contact angle θ$_A$ − Contact angle θ$_B$ (degrees) | Contact angle θ$_C$ (degrees) | Storage stability 1 (SiN) | Recyclability of container |
|---|---|---|---|---|---|---|---|---|
| Example 23 | Treatment liquid B | Electropolished stainless steel 1 | 95 | 100 | −5 | 9 | A | A |
| Example 24 | Treatment liquid A | PE | 88 | 86 | 2 | 18 | A | C |
| Example 25 | Treatment liquid A | PP | 91 | 86 | 5 | 15 | A | B |
| Example 26 | Treatment liquid A | PFA | 73 | 78 | −5 | 20 | A | A |
| Example 27 | Treatment liquid B | Electropolished Inconel | 83 | 92 | −9 | 17 | A | A |
| Example 28 | Treatment liquid C | Electropolished Hastelloy | 87 | 90 | −3 | 14 | A | A |
| Example 29 | Treatment liquid D | Electropolished Monel | 88 | 95 | −7 | 12 | A | A |
| Example 30 | Treatment liquid A | PTFE coating | 125 | 130 | −5 | 8 | A | A |
| Example 31 | Treatment liquid E | Buff polished stainless steel | 55 | 56 | −1 | 70 | A | C |
| Example 32 | Treatment liquid E | Electropolished stainless steel 2 | 25 | 41 | −16 | 95 | B | C |
| Example 33 | Treatment liquid F | Electropolished stainless steel 1 | 95 | 98 | −3 | 22 | B | C |
| Example 34 | Treatment liquid G | Electropolished stainless steel 1 | 95 | 97 | −2 | 35 | C | C |
| Example 35 | Treatment liquid H | Electropolished stainless steel 1 | 96 | 102 | −6 | 9 | A | B |
| Example 36 | Treatment liquid I | Electropolished stainless steel 1 | 97 | 102 | −5 | 9 | A | B |
| Example 37 | Treatment liquid J | Electropolished stainless steel 1 | 95 | 97 | −2 | 9 | A | C |
| Example 38 | Treatment liquid K | Electropolished stainless steel 1 | 88 | 90 | −2 | 9 | A | C |
| Example 39 | Treatment liquid L | Electropolished stainless steel 1 | 81 | 82 | −1 | 9 | B | C |
| Example 40 | Treatment liquid M | Electropolished stainless steel 1 | 79 | 81 | −2 | 9 | B | C |

TABLE 4

|  | Treatment liquid | Storage portion inner wall (Void volume: 30 vol %) | Contact angle θ (degrees) | Filling gas | Moisture content in filling gas (ppm by mass/L) | Storage stability 2 (SiN) | Recyclability of container |
|---|---|---|---|---|---|---|---|
| Example 41 | Treatment liquid A | Electropolished stainless steel 1 | 95 | Atmosphere | More than 100 | B | C |
| Example 42 | Treatment liquid A | Electropolished stainless steel 1 | 94 | Nitrogen gas A | 0.01 | A | A |
| Example 43 | Treatment liquid A | Electropolished stainless steel 1 | 95 | Nitrogen gas B | 0.5 | A | A |
| Example 44 | Treatment liquid A | Electropolished stainless steel 1 | 96 | Argon gas | 1 | A | A |
| Example 45 | Treatment liquid A | Electropolished stainless steel 1 | 94 | Nitrogen gas C | 10 | A | B |

TABLE 5

| | Treatment liquid | Storage portion inner wall (Filling gas: nitrogen gas A) (Void volume: 20 vol %) | Contact angle θ (degrees) | Fe Total metal amount ppt by mass | Fe Particulate metal amount ppt by mass | Cu Total metal amount ppt by mass | Cu Particulate metal amount ppt by mass |
|---|---|---|---|---|---|---|---|
| Example 46 | Treatment liquid B-1 | Electropolished stainless steel 1 | 95 | 1.0 | 5.0 | 25.0 | 5.0 |
| Example 47 | Treatment liquid B-2 | Electropolished stainless steel 1 | 93 | 13.0 | 2.1 | 2.0 | 0.4 |
| Example 48 | Treatment liquid B-3 | Electropolished stainless steel 1 | 94 | 15.0 | 2.3 | 2.0 | 1.3 |
| Example 49 | Treatment liquid B-4 | Electropolished stainless steel 1 | 96 | 245.0 | 41.0 | 91.0 | 16.0 |
| Example 50 | Treatment liquid B-5 | Electropolished stainless steel 1 | 94 | 6.0 | 0.5 | 1.2 | 0.3 |
| Example 51 | Treatment liquid B-6 | Electropolished stainless steel 1 | 95 | 23.0 | 0.3 | 12.0 | 5.0 |
| Example 52 | Treatment liquid B-7 | Electropolished stainless steel 1 | 95 | 80.0 | 11.0 | 41.0 | 6.3 |
| Example 53 | Treatment liquid B-8 | Electropolished stainless steel 1 | 94 | 330.0 | 61.0 | 186.0 | 40.0 |
| Example 54 | Treatment liquid B-9 | Electropolished stainless steel 1 | 96 | 59.0 | 13.2 | 37.0 | 11.0 |
| Example 55 | Treatment liquid B-10 | Electropolished stainless steel 1 | 93 | 333.0 | 61.0 | 98.0 | 22.0 |
| Example 56 | Treatment liquid B-11 | Electropolished stainless steel 1 | 95 | 2 | 0.00 | 2 | 0.00 |

| | Zn Total metal amount ppt by mass | Zn Particulate metal amount ppt by mass | Particulate Total metal amount (Sum) ppt by mass | Particulate metal amount (Sum) ppt by mass | Storage stability 2 (SiN) | Recyclability of container |
|---|---|---|---|---|---|---|
| Example 46 | 4.0 | 0.6 | 30.00 | 10.60 | A | A |
| Example 47 | 1.3 | 0.4 | 16.30 | 2.90 | A | A |
| Example 48 | 2.5 | 0.2 | 19.50 | 3.80 | A | A |
| Example 49 | 35.0 | 7.0 | 371.00 | 64.00 | B | B |
| Example 50 | 0.5 | 0.1 | 7.70 | 0.90 | A | A |
| Example 51 | 14.0 | 6.4 | 49.00 | 11.70 | A | A |
| Example 52 | 12.0 | 1.3 | 133.00 | 18.60 | B | A |
| Example 53 | 39.0 | 4.5 | 555.00 | 105.50 | C | C |
| Example 54 | 29.0 | 9.3 | 125.00 | 33.50 | B | A |
| Example 55 | 31.0 | 7.0 | 462.00 | 90.00 | B | B |
| Example 56 | 2 | 0.00 | 6 | 0.00 | A | C |

The evaluation described in Table 2 was carried out in the same manner except that, in each of Example 1, Example 9, and Example 21, the wafers were changed from SiC, SiO$_2$, or SiN materials to the following <A> to <E>. The same results as in Example 1, Example 9, and Example 21 were obtained.

<A> Poly-Si S.E.H AMERICA.
<B> Si$_{0.5}$Ge$_{0.85}$ Advanced materials technology Si/SiGe
<C> Si$_{0.1}$5Ge$_{0.85}$ Advanced materials technology Si/SiGe
<D> Ge KST world corp. Si/Ge
<E> BDIII(Low-k) Advanced materials technology Bare Si/BDIII (k value is about 2.2)

What is claimed is:

1. A storage container comprising:
  a storage portion storing a liquid composition containing an organic solvent having a moisture concentration of 400 ppm by mass or less and a surface treatment agent, wherein at least a portion, which is in contact with the liquid composition, of an inner wall of the storage portion has a contact angle θ with respect to water of 10 degrees or more and 150 degrees or less.

2. The storage container according to claim 1, wherein the surface treatment agent is a silane compound.

3. The storage container according to claim 1, wherein the surface treatment agent is a silylating agent.

4. The storage container according to claim 1, wherein the liquid composition is a composition for forming a water-repellent protective film.

5. The storage container according to claim 1, wherein the portion, which is in contact with the liquid composition, of the inner wall of the storage portion has a contact angle difference $|\theta_B-\theta_A|$ of 3 degrees or more and 15 degrees or less in the case where a contact angle with respect to water after contact with the liquid composition is taken as $\theta_B$ and a contact angle with respect to water before contact with the liquid composition is taken as $\theta_A$.

6. The storage container according to claim 1, wherein the portion, which is in contact with the liquid composition, of the inner wall of the storage portion has a contact angle $\theta_C$ with respect to the liquid composition of less than 90 degrees.

7. The storage container according to claim 1, wherein the organic solvent has a moisture concentration of 200 ppm by mass or less.

8. The storage container according to claim 1, wherein the organic solvent has a moisture concentration of 0.01 ppt by mass to 100 ppm by mass.

9. The storage container according to claim 1, wherein the percentage of the voids in the storage portion storing the liquid composition is 40% to 0.01% by volume.

10. The storage container according to claim 1, wherein the moisture concentration in the gas occupying the voids in the storage portion storing the liquid composition is 0.01 ppt by mass to 1 ppm by mass.

11. The storage container according to claim 1, wherein at least a portion, which is in contact with the liquid composition, of the inner wall of the storage portion is formed of a material containing at least one selected from polytetrafluoroethylene, perfluoroalkoxy alkane, polyethylene, or polypropylene.

12. The storage container according to claim 1, wherein at least a portion, which is in contact with the liquid composition, of the inner wall of the storage portion is formed of a material containing at least one selected from stainless steel, Hastelloy, Inconel, or Monel.

13. The storage container according to claim 1, wherein the surface treatment agent is a silylating agent represented by General Formula [1]:

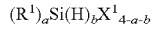   [1]

in the formula,
R$^1$ represents a monovalent organic group containing a hydrocarbon group having 1 to 18 carbon atoms in which some or all of the hydrogen atoms may be substituted by fluorine atoms, and in the case where there are a plurality of R$^1$'s, the R$^1$'s may be the same or different;

X$^1$ represents a group or atom selected from the group consisting of a monovalent substituent in which an atom bonded to a silicon atom is a nitrogen atom, a monovalent substituent in which an atom bonded to a silicon atom is an oxygen atom, a halogen atom, a nitrile group, and —CO—NH—Si(CH3)$_3$, and in the case where there are a plurality of X$^1$'s, the X$^1$'s may be the same or different; and a is an integer of 1 to 3, b is an integer of 0 to 2, and the sum of a and b is 1 to 3.

14. A storage container comprising:
a storage portion storing a liquid composition containing an organic solvent having a moisture concentration of 400 ppm by mass or less and a surface treatment agent, wherein at least a portion, which is in contact with the liquid composition, of an inner wall of the storage portion has a contact angle θ with respect to water of 10 degrees or more and 150 degrees or less, and wherein the liquid composition contains one or more metal atoms selected from metal species consisting of Cu, Fe, and Zn, and a total content of particulate metals including at least one of the metal atoms is 0.01 to 100 ppt by mass based on the total mass of the liquid composition.

15. The storage container according to claim 14, wherein the mass of the particulate metal is measured by an SP-ICP-MS method.

16. A method for storing a liquid composition containing an organic solvent having a moisture concentration of 400 ppm by mass or less and a surface treatment agent, comprising:
storing the liquid composition in a storage container in which at least a portion of the inner wall has a storage portion constituted of a member having a contact angle θ with respect to water of 10 degrees or more and 150 degrees or less.

17. The method for storing a liquid composition according to claim 16, wherein the surface treatment agent is a silane compound.

18. The method for storing a liquid composition according to claim 16, wherein the surface treatment agent is a silylating agent.

19. The method for storing a liquid composition according to claim 16, wherein the liquid composition is a composition for forming a water-repellent protective film.

20. The method for storing a liquid composition according to claim 16, wherein the portion, which is in contact with the liquid composition, of the inner wall of the storage portion has a contact angle difference $|\theta_B-\theta_A|$ of 3 degrees or more and 15 degrees or less in the case where a contact angle with respect to water before contact with the liquid composition is taken as $\theta_A$ and a contact angle with respect to water after contact with the liquid composition is taken as $\theta_B$.

21. The method for storing a liquid composition according to claim 16, wherein the portion, which is in contact with the liquid composition, of the inner wall of the storage portion has a contact angle $\theta_C$ with respect to the liquid composition of less than 90 degrees.

22. The method for storing a liquid composition according to claim 16, wherein the organic solvent has a moisture concentration of 200 ppm by mass or less.

23. The method for storing a liquid composition according to claim 16, wherein the organic solvent has a moisture concentration of 0.01 ppt by mass to 100 ppm by mass.

24. The method for storing a liquid composition according to claim 16, wherein the percentage of the voids in the storage portion storing the liquid composition is 40% to 0.01% by volume.

25. The method for storing a liquid composition according to claim 16, wherein the moisture concentration in the gas occupying the voids in the storage portion storing the liquid composition is 0.01 ppt by mass to 1 ppm by mass.

26. The method for storing a liquid composition according to claim 16, wherein the liquid composition contains one or two or more metal atoms selected from metal species consisting of Cu, Fe, and Zn, and a total content of the particulate metals including at least one of the metal atoms is 0.01 to 100 ppt by mass based on the total mass of the liquid composition.

27. The method for storing a liquid composition according to claim 26, wherein the mass of the particulate metal is measured by an SP-ICP-MS method.

28. The method for storing a liquid composition according to claim 16, wherein at least a portion, which is in contact with the liquid composition, of the inner wall of the storage portion is formed of a material containing at least one selected from polytetrafluoroethylene, perfluoroalkoxy alkane, polyethylene, or polypropylene.

29. The method for storing a liquid composition according to claim 16, wherein at least a portion, which is in contact with the liquid composition, of the inner wall of the storage portion is formed of a material containing at least one selected from stainless steel, Hastelloy, Inconel, or Monel.

30. The method for storing a liquid composition according to claim 16, wherein the surface treatment agent is a silylating agent represented by General Formula [1]:

$$(R^1)_a Si(H)_b X^1{}_{4-a-b} \qquad [1]$$

in the formula, $R^1$ represents a monovalent organic group containing a hydrocarbon group having 1 to 18 carbon atoms in which some or all of the hydrogen atoms may be substituted by fluorine atoms, and in the case where there are a plurality of $R^1$'s, the $R^1$'s may be the same or different;

$X^1$ represents a group or atom selected from the group consisting of a monovalent substituent in which an atom bonded to a silicon atom is a nitrogen atom, a monovalent substituent in which an atom bonded to a silicon atom is an oxygen atom, a halogen atom, a nitrile group, and —CO—NH—Si(CH$_3$)$_3$, and in the case where there are a plurality of $X^1$'s, the $X^1$'s may be the same or different; and a is an integer of 1 to 3, b is an integer of 0 to 2, and the sum of a and b is 1 to 3.

* * * * *